United States Patent
Sung

(10) Patent No.: US 9,860,017 B2
(45) Date of Patent: Jan. 2, 2018

(54) METHOD OF GENERATING DATA

(71) Applicant: Samsung Electronics Co., Ltd., Gyeonggi-do (KR)

(72) Inventor: Hyuk-Jun Sung, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/991,452

(22) Filed: Jan. 8, 2016

(65) Prior Publication Data

US 2016/0233981 A1    Aug. 11, 2016

(30) Foreign Application Priority Data

Feb. 9, 2015  (KR) .................. 10-2015-0019153

(51) Int. Cl.
| | |
|---|---|
| H04L 1/00 | (2006.01) |
| H04L 7/00 | (2006.01) |
| H03D 1/00 | (2006.01) |
| H04K 1/00 | (2006.01) |

(52) U.S. Cl.
CPC ............ *H04L 1/0046* (2013.01); *H03D 1/00* (2013.01); *H04K 1/00* (2013.01); *H04L 1/0075* (2013.01); *H04L 7/00* (2013.01)

(58) Field of Classification Search
CPC ....... H04L 1/0046; H04L 1/0075; H04L 7/00; H03D 1/00; H04K 1/00
See application file for complete search history.

(56) References Cited

U.S. PATENT DOCUMENTS

| | | | |
|---|---|---|---|
| 7,817,015 B1 * | 10/2010 | Tiernay ............. | G06K 19/0723 340/10.4 |
| 7,926,719 B2 | 4/2011 | Spiess et al. | |
| 8,472,560 B2 | 6/2013 | Rezayee et al. | |
| 8,537,907 B2 | 9/2013 | Sung | |
| 2008/0252459 A1 * | 10/2008 | Butler ................. | G06K 7/0008 340/572.1 |
| 2010/0141378 A1 | 6/2010 | Lee et al. | |
| 2010/0327066 A1 * | 12/2010 | Khan ................. | G06K 17/0022 235/462.01 |
| 2011/0206160 A1 | 8/2011 | Sung et al. | |
| 2012/0128106 A1 * | 5/2012 | Takayama .............. | H04L 7/042 375/343 |
| 2012/0170690 A1 | 7/2012 | Ngo et al. | |

(Continued)

FOREIGN PATENT DOCUMENTS

| | | |
|---|---|---|
| EP | 2 472 437 | 7/2012 |
| KR | 10-1114179 | 2/2012 |
| KR | 10-1189286 | 10/2012 |

*Primary Examiner* — David B. Lugo
(74) *Attorney, Agent, or Firm* — The Farrell Law Firm, P.C.

(57) ABSTRACT

A method of generating data is provided. The method includes providing, by a peak comparator, a searcher enable signal and peak comparator output data based on result values that are generated by multiplying an input signal having a plurality of levels and a predetermined convolution pattern, providing by a start pattern searcher, a data determiner enable signal by comparing the peak comparator output data and a predetermined start pattern according to the searcher enable signal; and providing, by a data determiner, result data corresponding to the input signal based on the data determiner enable signal, the input signal and a predetermined filter mask pattern.

19 Claims, 27 Drawing Sheets

(56) References Cited

U.S. PATENT DOCUMENTS

2013/0344805 A1* 12/2013 Lefley ................ H04B 5/0031
                                                    455/41.1
2014/0073241 A1    3/2014 Luong et al.
2014/0256252 A1    9/2014 Geslin et al.

* cited by examiner

| STR_P | 1 | 1 | 1 | 1 |

| PCO_D | 1 | 1 | 1 | 1 |

METHOD OF GENERATING DATA

PRIORITY

This application claims priority under 35 USC §119(a) to a Korean Patent Application filed on Feb. 9, 2015 in the Korean Intellectual Property Office (KIPO) and assigned Serial No. 10-2015-0019153, the entire contents of which are incorporated herein by reference.

BACKGROUND

1. Field of the Disclosure

The present disclosure relates generally to wireless communication, and more particularly, to a method of generating data.

2. Description of the Related Art

As a distance between a transmitter and a receiver is increased, a reception performance of a signal that is received in the receiver may decrease. Research is in progress to increase the reception performance.

SUMMARY

An aspect of the present disclosure is to provide a method of generating data capable of increasing a reception performance by providing a result data corresponding to an input signal based on a data determiner enable signal, an input signal and a filter mask pattern.

Another aspect of the present disclosure provides that a level of the convolution pattern during a first pattern interval may be a first pattern level and a level of the convolution pattern during a second pattern interval after the first pattern interval may be a second pattern level that is different from the first pattern level.

Another aspect of the present disclosure provides that when the result value is greater than a noise threshold value that is stored in the peak comparator, the searcher enable signal may be activated and when the searcher enable signal is activated, the peak comparator may provide the peak comparator output data corresponding to the result value.

Another aspect of the present disclosure provides that the convolution pattern may be stored in a convolution pattern register and the convolution pattern may be controlled by a controller.

Another aspect of the present disclosure provides that when the searcher enable signal is activated and the peak comparator output data is equal to the predetermined start pattern, the data determiner enable signal may be activated by the start pattern searcher.

Another aspect of the present disclosure provides that the start pattern may be stored in a start pattern register and the start pattern may be controlled by a controller.

Another aspect of the present disclosure provides that the data determiner may include a calculator and a comparator, where the calculator may provide a calculation result by multiplying the input signal and the filter mask pattern, and the comparator may provide a result data by comparing the calculation result and a predetermined data threshold value.

Another aspect of the present disclosure provides that the filter mask pattern may be in synchronization with the input signal.

Another aspect of the present disclosure provides that when an absolute value of the calculation result is greater than the data threshold value, the comparator may provide a first result level as the result data and when the absolute value of the calculation result is less than the data threshold value, the comparator may provide a second result level as the result data.

Another aspect of the present disclosure provides that when each of the first result level and the second result level is sequentially repeated more than three times, the data determiner may stop providing the result data.

Another aspect of the present disclosure provides that the data determiner may provide the filter mask pattern to the calculator based on a time interval among peak values of the result values. A time when the filter mask pattern is provided to the calculator may be determined by a timer value that is stored in a mask matching timer register.

Another aspect of the present disclosure provides that the filter mask pattern may include a plurality of odd number time intervals and a plurality of even number time intervals, the plurality of odd number time intervals may be a first mask level, and the plurality of even number time intervals may be a second mask level.

Another aspect of the present disclosure provides that a length of the filter mask pattern may be stored in a counter register and the length of the filter mask pattern may be controlled by a controller, where the input signal may be symbolized by a plurality of positive levels and a plurality of negative levels.

Another aspect of the present disclosure provides that when the result value is greater than a noise threshold value that is stored in the peak comparator, the searcher enable signal may be activated and when the searcher enable signal is activated, the peak comparator may provide the peak comparator output data corresponding to the result value.

Another aspect of the present disclosure provides that generating data may increase the reception performance by providing the result data corresponding to the input signal based on the data determiner enable signal, the input signal and the filter mask pattern.

Another aspect of the present disclosure provides that the peak comparator may include a register configured to store a noise threshold value, and the peak comparator may activate the searcher enable signal if one of the result values is greater than the noise threshold value that is stored in the register.

Another aspect of the present disclosure provides that the start pattern searcher may include a register configured to store the predetermined start pattern, and the start pattern searcher may activate the data determiner enable signal if the peak comparator output data is equal to the predetermined start pattern that is stored in the register.

Another aspect of the present disclosure provides that the data determiner may include a calculator configured to provide a calculation result by multiplying the input signal and the predetermined filter mask pattern, and a comparator configured to provide the result data by comparing the calculation result and a predetermined data threshold value.

Another aspect of the present disclosure provides that the data generating device may further include an amplifier configured to generate the input signal having a first amplification level and a second amplification level by amplifying a comparison signal having a first level and a second level.

In accordance with an aspect of the present disclosure, a method of generating data is provided. The method includes providing, by a peak comparator, a searcher enable signal and peak comparator output data based on result values that are generated by multiplying an input signal having a plurality of levels and a predetermined convolution pattern, providing, by a start pattern searcher, a data determiner enable signal by comparing the peak comparator output data and a predetermined start pattern according to the searcher enable signal, and providing, by a data determiner, result data corresponding to the input signal based on the data determiner enable signal, the input signal and a predetermined filter mask pattern.

In accordance with another aspect of the present disclosure, a method of generating data is provided. The method includes generating, by an amplifier, an input signal having a first amplification level and a second amplification level by amplifying a comparison signal having a first level and a second level, providing a peak comparator, a searcher enable signal and peak comparator output data based on result values that are generated by multiplying the input signal and a predetermined convolution pattern, providing a start pattern searcher, a data determiner enable signal by comparing the peak comparator output data and a predetermined start pattern according to the searcher enable signal, and providing, by a data determiner, a result data corresponding to the input signal based on the data determiner enable signal, the input signal and a predetermined filter mask pattern.

In accordance with another aspect of the present disclosure, a data generating device includes a peak comparator, a start pattern searcher and a data determiner. The peak comparator provides a searcher enable signal and peak comparator output data based on result values that are generated by multiplying an input signal having a plurality of levels and a predetermined convolution pattern. The start pattern searcher provides a data determiner enable signal by comparing the peak comparator output data and a predetermined start pattern according to the searcher enable signal. The data determiner provides result data corresponding to the input signal based on the data determiner enable signal, the input signal and a predetermined filter mask pattern.

BRIEF DESCRIPTION OF THE DRAWINGS

The above and other aspects, features, and advantages of the present disclosure will be more apparent from the following detailed description, taken in conjunction with the accompanying drawings, in which.

DETAILED DESCRIPTION OF THE EMBODIMENTS OF THE PRESENT DISCLOSURE

Figure 1:
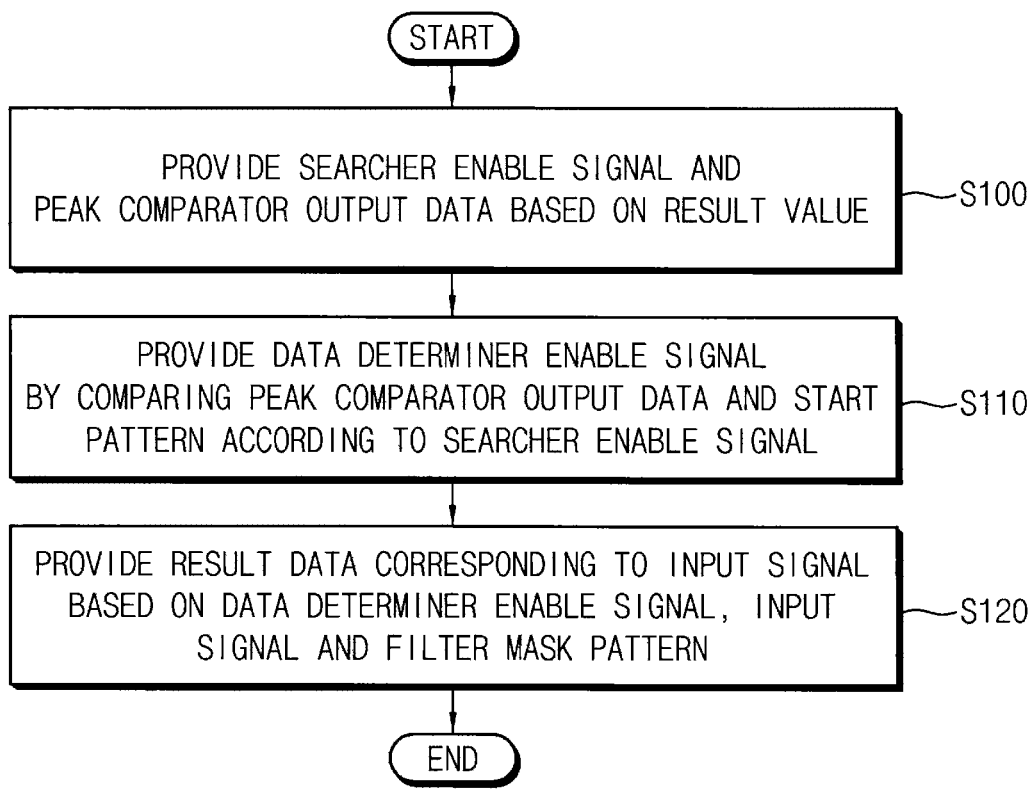
FIG. 1 is a flowchart of a method of generating data according to an embodiment of the present disclosure.

Various embodiments of the present disclosure are described more fully hereinafter with reference to the accompanying drawings, in which some embodiments are shown. The present disclosure may, however, be embodied in many different forms and should not be construed as limited to the embodiments set forth herein. Rather, these embodiments are provided so that the present disclosure will be thorough and complete, and will fully convey the scope of the present disclosure to those skilled in the art. In the accompanying drawings, the sizes and relative sizes of layers and regions may be exaggerated for clarity. Like numerals refer to like elements throughout.

It will be understood that, although the terms "first," "second," "third" etc. may be used herein to describe various elements, these elements should not be limited by these terms. These terms are used to distinguish one element from another. Thus, a first element discussed below could be referred to as a second element without departing from the teachings of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing certain embodiments of the present disclosure only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in the present disclosure, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meanings as commonly understood by one of ordinary skill in the art to which the present disclosure belongs. It will be further understood that terms, such as those defined in commonly used dictionaries, should be interpreted as having meanings that are consistent with their meanings in the context of the relevant art and will not be interpreted in an idealized or overly formal sense unless expressly so defined herein.

Figure 2:
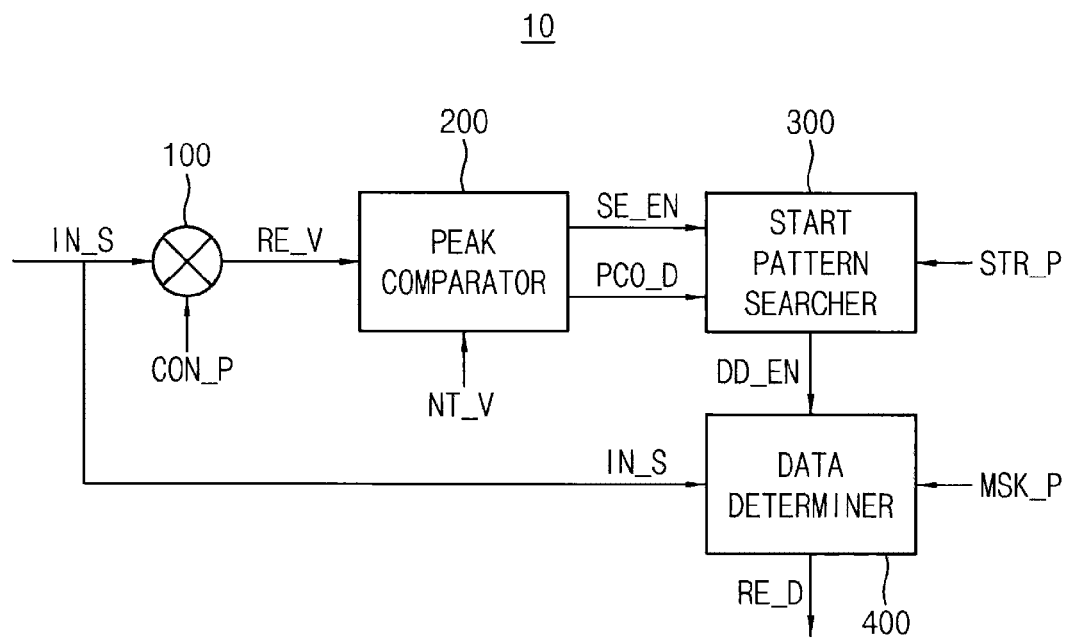
FIG. 2 is a block diagram of a data generating device according to an embodiment of the present disclosure.

FIG. 1 is a flowchart of a method of generating data according to an embodiment of the present disclosure and FIG. 2 is a block diagram of a data generating device according to an embodiment of the present disclosure.

Referring to FIGS. 1 and 2, a data generating device 10 may include a result value calculator 100, a peak comparator 200, a start pattern searcher 300 and a data determiner 400. The result value calculator 100 may generate result values RE_V by multiplying an input signal IN_S and a predetermined convolution pattern CON_P. In a method of generating data, a peak comparator 200 provides a searcher enable signal SE_EN and peak comparator output data PCO_D based on the result values RE_V that are generated by multiplying an input signal IN_S having a plurality of levels and the predetermined convolution pattern CON_P in step S100. A start pattern searcher 300 provides a data determiner enable signal DD_EN by comparing the peak comparator output data PCO_D and a predetermined start pattern STR_P according to the searcher enable signal SE_EN in step S110. A data determiner 400 provides a result data RE_D corresponding to the input signal IN_S based on the data determiner enable signal DD_EN, the input signal IN_S and a predetermined filter mask pattern MSK_P in step S120. The method of generating data according to an embodiment of the present disclosure may increase the reception performance by providing the result data RE_D corresponding to the input signal IN_S based on the data determiner enable signal DD_EN, the input signal IN_S and the filter mask pattern MSK_P.

Figure 3:
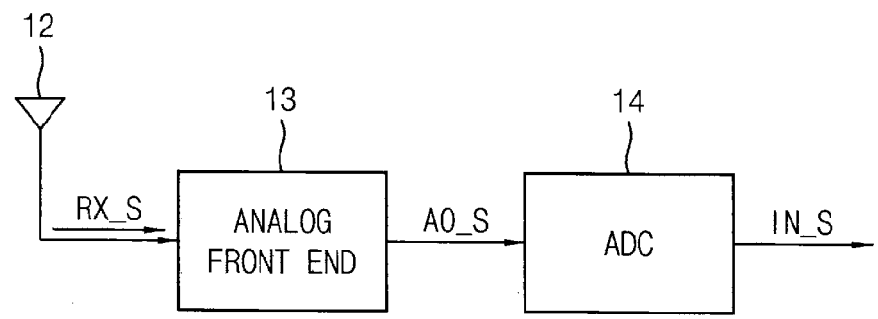
FIG. 3 is a block diagram and FIG. 4 is a graph of an input signal to the data generating device of FIG. 2 according to an embodiment of the present disclosure.
Figure 4:
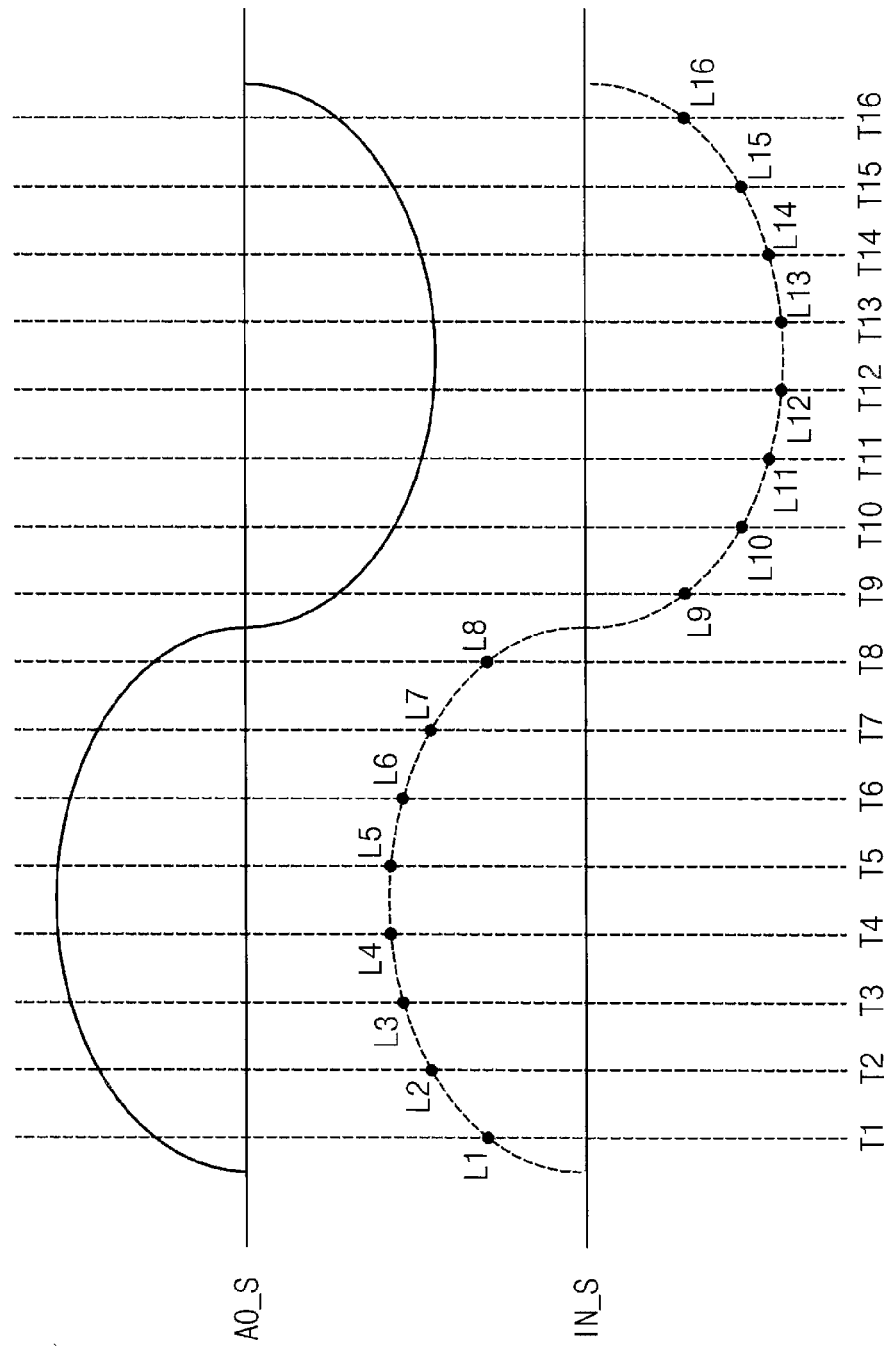

FIG. 3 is a block diagram and FIG. 4 is a graph of an input signal to the data generating device of FIG. 2 according to an embodiment of the present disclosure.

Referring to FIGS. 3 and 4, an analog front end 13 may receive a reception signal RX_S. For example, the reception signal RX_S may be a wireless signal that is received through an antenna 12. The analog front end 13 may provide an analog output signal AO_S by processing the reception signal RX_S. An analog to digital converter (ADC) 14 may provide the input signal IN_S having the plurality of levels by sampling the analog output signal AO_S. For example, the analog to digital converter 14 may generate the input signal IN_S having a first level L1 in a first time T1. The input signal IN_S having the first level L1 may be provided to the data generating device 10. In addition, the analog to digital converter 14 may generate the input signal IN_S having a second level L2 in a second time T2. The input signal IN_S having the second level L2 may be provided to the data generating device 10. In the same manner, the analog to digital converter 14 may generate the input signal IN_S having a sixteenth level L16 in a sixteenth time T16. The input signal IN_S having the sixteenth level L16 may be provided to the data generating device 10. The input signal IN_S may be a digital signal having the plurality of levels.

Figure 5:
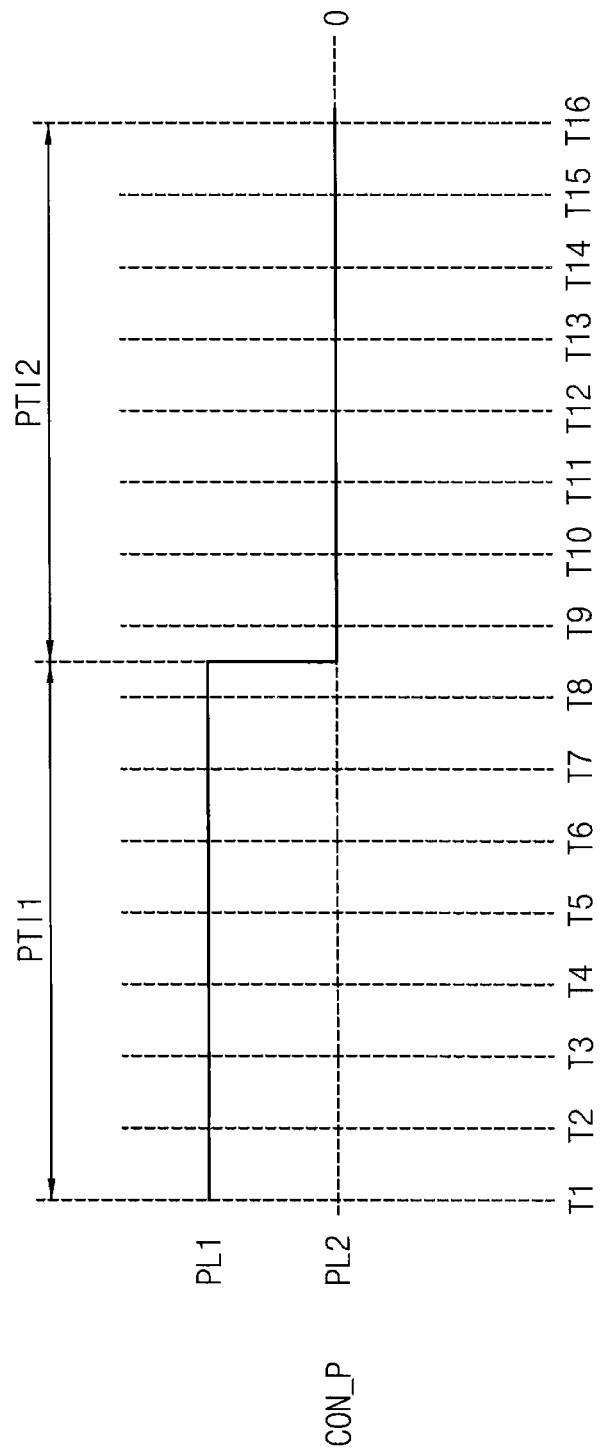
FIG. 5 is a graph of a convolution pattern provided to the data generating device of FIG. 2 according to an embodiment of the present disclosure.
Figure 6:
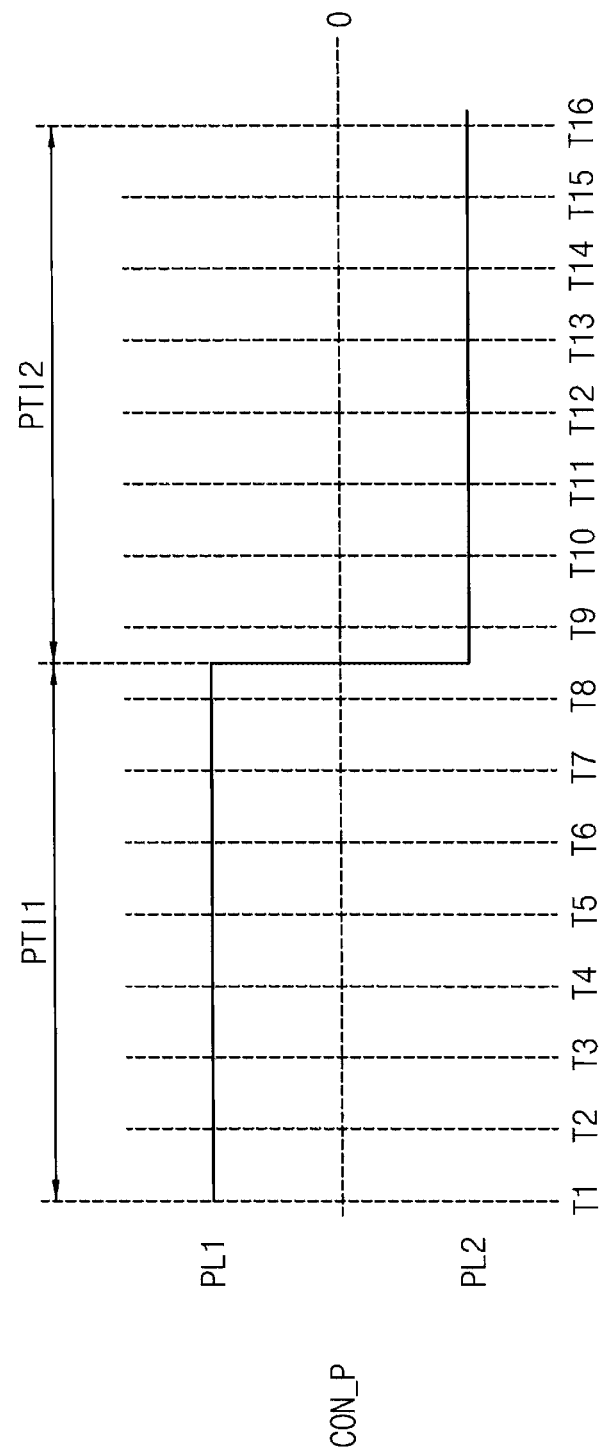
FIG. 6 is a graph of a convolution pattern that is provided to the data generating device of FIG. 2 according to an embodiment of the present disclosure.

FIG. 5 is a graph of a convolution pattern provided to the data generating device of FIG. 2 according to an embodiment of the present disclosure and FIG. 6 is a graph of a convolution pattern that is provided to the data generating device of FIG. 2 according to an embodiment of the present disclosure.

Referring to FIG. 5, a convolution pattern CON_P may include a first pattern interval PT11 and a second pattern interval PT12. The second pattern interval PT12 may be after the first pattern interval PT11. The first pattern level PL1 may be different from the second pattern level PL2. For example, a first time T1 to an eighth time T8 may be included in the first pattern interval PT11. A ninth time T9 to a sixteenth time T16 may be included in the second pattern interval PT12. During the first pattern interval PT11, the convolution pattern CON_P may be greater than 0. During the second pattern interval PT12, the convolution pattern CON_P may be equal to 0. In an embodiment of the present disclosure, a level of the convolution pattern CON_P during first pattern interval PT11 may be a first pattern level PL1 and a level of the convolution pattern CON_P during the second pattern interval PT12 may be a second pattern level PL2. For example, the first pattern level PL1 may be greater than 0 and the second pattern level PL2 may be equal to 0.

Referring to FIG. 6, the convolution pattern CON_P may include a first pattern interval PT11 and a second pattern interval PT12. For example, a first time T1 to an eighth time T8 may be included in the first pattern interval PT11. A ninth time T9 to a sixteenth time T16 may be included in the second pattern interval PT12. During the first pattern interval PT11, the convolution pattern CON_P may be greater than 0. During the second pattern interval PT12, the convolution pattern CON_P may be less than 0. In an embodiment of the present disclosure, a level of the convolution pattern CON_P during the first pattern interval PT11 may be a first pattern level PL1 and a level of the convolution pattern CON_P during the second pattern interval PT12 may be a second pattern level PL2. For example, the first pattern level PL1 may be greater than 0 and the second pattern level PL2 may be less than 0. The method of generating data according to an embodiment of the present disclosure may increase the reception performance by providing the result data RE_D corresponding to the input signal IN_S based on the data determiner enable signal DD_EN, the input signal IN_S and the filter mask pattern MSK_P.

Figure 7:
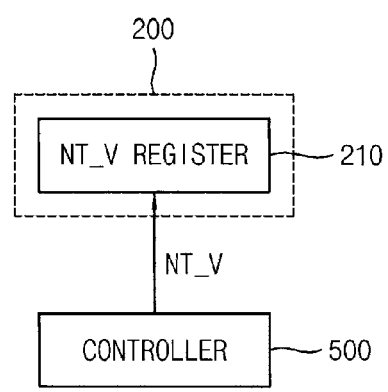
FIG. 7 is a block diagram of a noise threshold value that is stored in a peak comparator of the data generating device of FIG. 2 according to an embodiment of the present disclosure.
Figure 8:
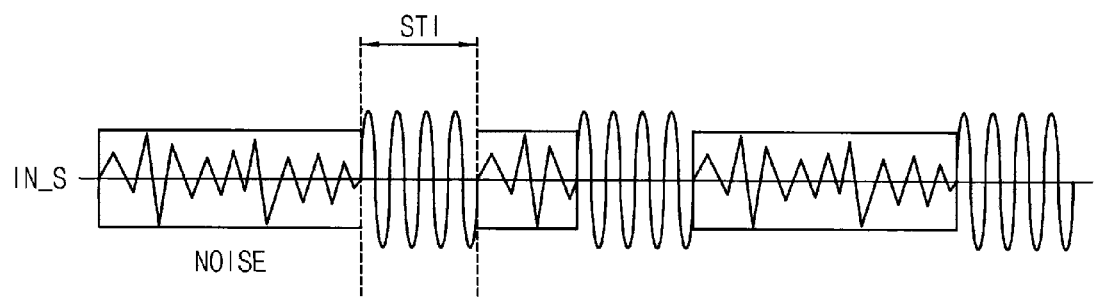
FIG. 8 is a graph of an input signal to the data generating device of FIG. 2 according to an embodiment of the present disclosure.
Figure 9:
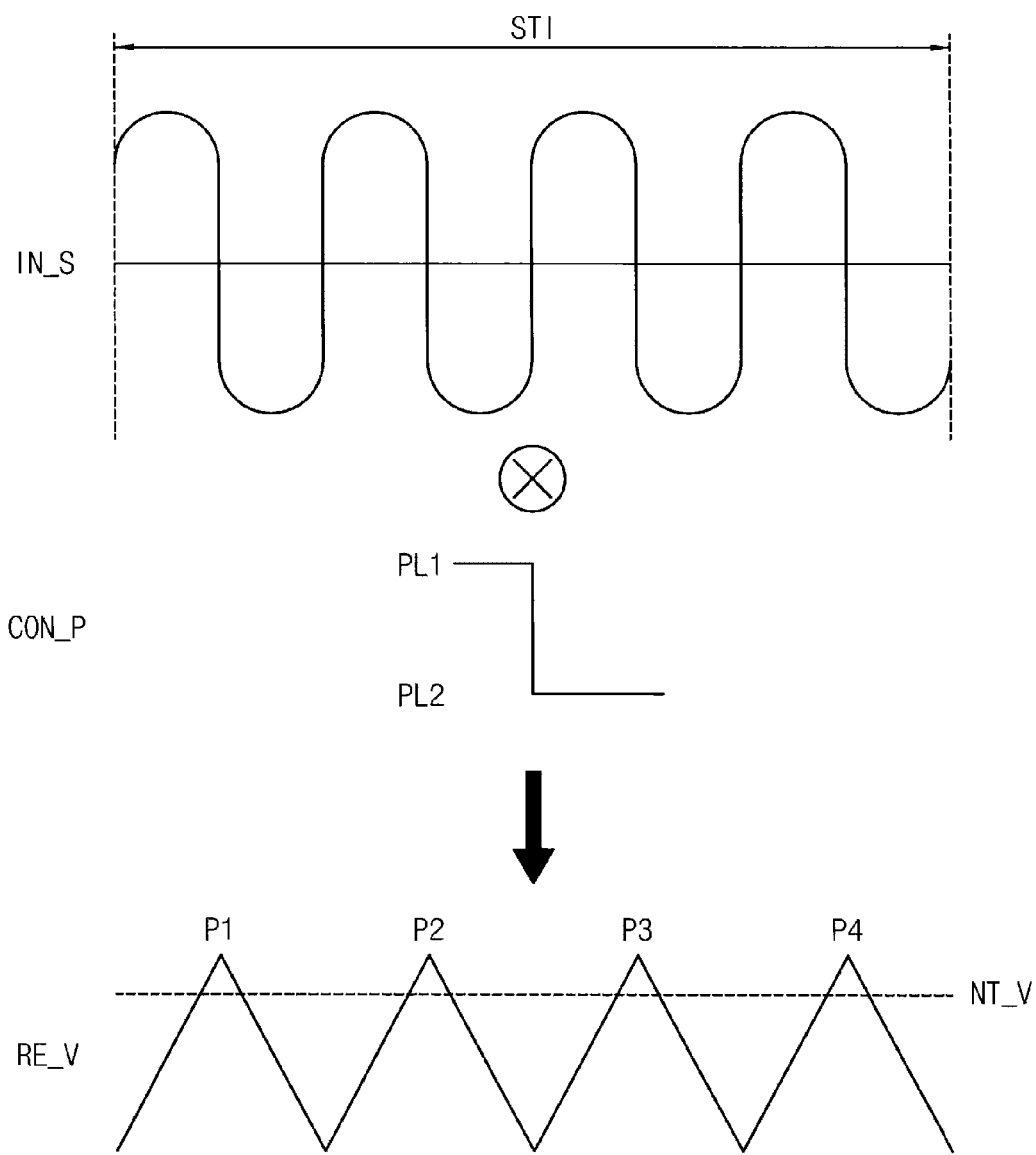
FIG. 9 is a graph of an operation of a peak comparator included in the data generating device of FIG. 2 according to an embodiment of the present disclosure.

FIG. 7 is a block diagram of a noise threshold value that is stored in a peak comparator of the data generating device of FIG. 2 according to an embodiment of the present disclosure, FIG. 8 is a graph of an input signal to the data generating device of FIG. 2 according to an embodiment of the present disclosure and FIG. 9 is a graph of an operation of a peak comparator included in the data generating device of FIG. 2 according to an embodiment of the present disclosure.

Referring to FIGS. 1 and 7, the peak comparator 200 may include a noise threshold value register 210 where the noise threshold value NT_V is stored. The noise threshold value NT_V may be changed according to the surrounding environment of the data generating device 10. When noise in the surroundings of the data generating device 10 is changed, a controller 500 may control the noise threshold value NT_V by controlling a noise threshold value register 210. The controller 500 may be a central processing unit that controls the data generating device 10. For example, when the noise in the surroundings of the data generating device 10 is increased, the controller 500 may increase the noise threshold value NT_V by controlling the noise threshold value register 210. When the noise in the surroundings of the data generating device 10 is decreased, the controller 500 may decrease the noise threshold value NT_V by controlling the noise threshold value register 210.

Referring to FIGS. 8 and 9, the input signal IN_S may include a start interval STI. In the start interval STI, the result value calculator 100 may generate result values RE_V by multiplying an input signal IN_S and a predetermined convolution pattern CON_P. In the start interval STI, the result value calculator 100 may generate a plurality of peak values of the result values RE_V. For example, in the start interval STI, the result value calculator 100 may generate a first peak value P1, a second peak value P2, a third peak value P3 and a fourth peak value P4.

The peak comparator 200 provides a searcher enable signal SE_EN and peak comparator output data PCO_D based on the result values RE_V that are generated by multiplying an input signal IN_S having a plurality of levels and the predetermined convolution pattern CON_P. In an embodiment of the present disclosure, when the result value RE_V is greater than the noise threshold value NT_V that is stored in the peak comparator 200, the searcher enable signal SE_EN may be activated. For example, in the start interval STI, the first peak value P1 among the result values RE_V that are generated by the result value calculator 100 may be greater than the noise threshold. When the first peak value P1 is greater than the noise threshold, the searcher enable signal SE_EN may be activated. In addition, the first peak value P1 among the result values RE_V that are generated by the result value calculator 100 may be less than the noise threshold. When the first peak value P1 is less than the noise threshold, the searcher enable signal SE_EN may be deactivated. In an embodiment of the present disclosure, when the searcher enable signal SE_EN is activated, the peak comparator 200 may provide the peak comparator output data PCO_D corresponding to the result value RE_V. For example, the peak comparator output data PCO_D corresponding to the result value RE_V may be 1111. When the first peak value P1 is greater than the noise threshold value NT_V, the searcher enable signal SE_EN is activated by the peak comparator 200. When the searcher enable signal SE_EN is activated, the peak comparator 200 may provide 1111 to the start pattern searcher 300. 1111 may be the peak comparator output data PCO_D corresponding to the result value RE_V. The method of generating data according to an embodiment of the present disclosure may increase the reception performance by providing the result data RE_D corresponding to the input signal IN_S based on the data determiner enable signal DD_EN, the input signal IN_S and the filter mask pattern MSK_P.

Figure 10:
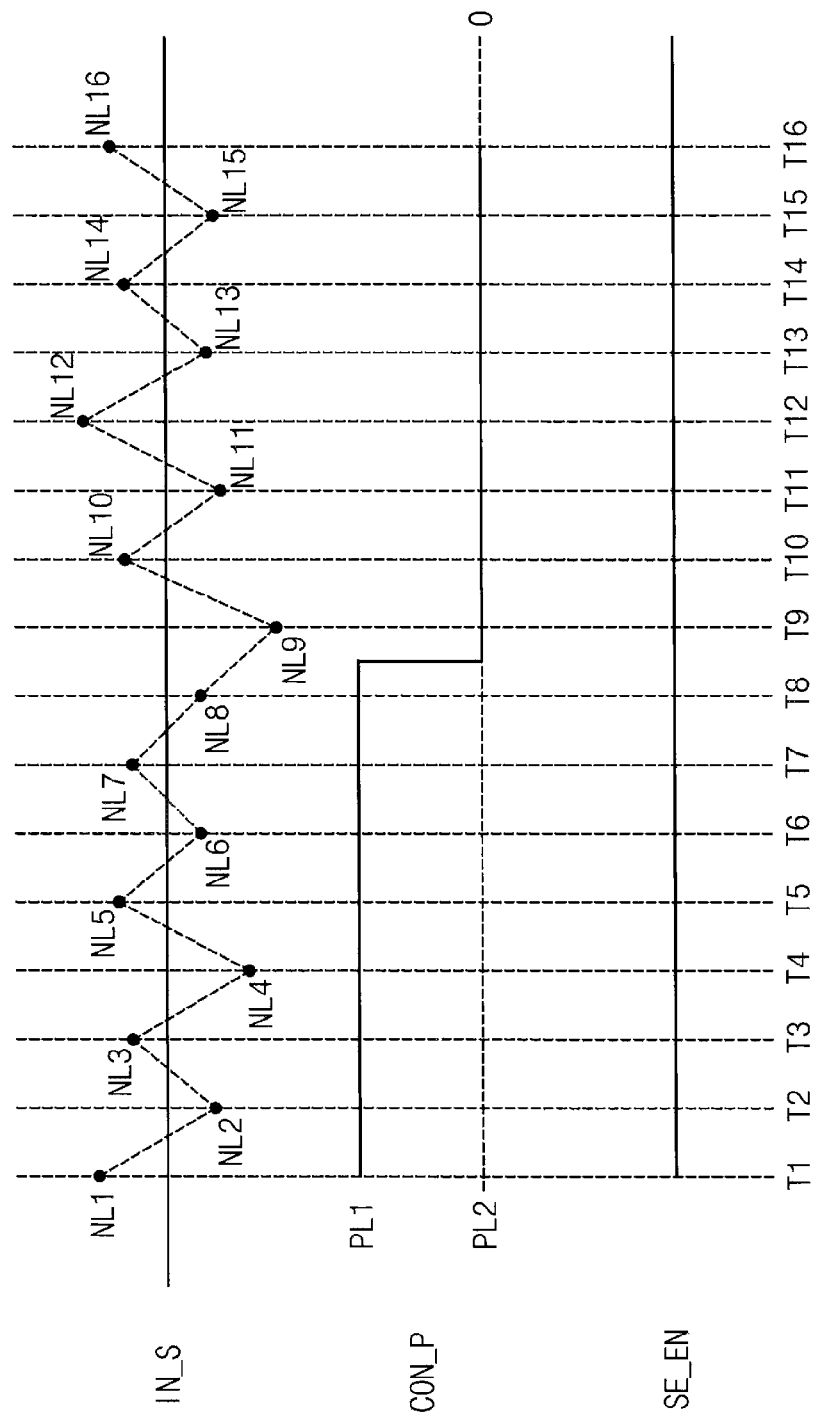
FIGS. 10 and 11 are graphs of an operation of a peak comparator included in the data generating device of FIG. 2 according to an embodiment of the present disclosure.
Figure 11:
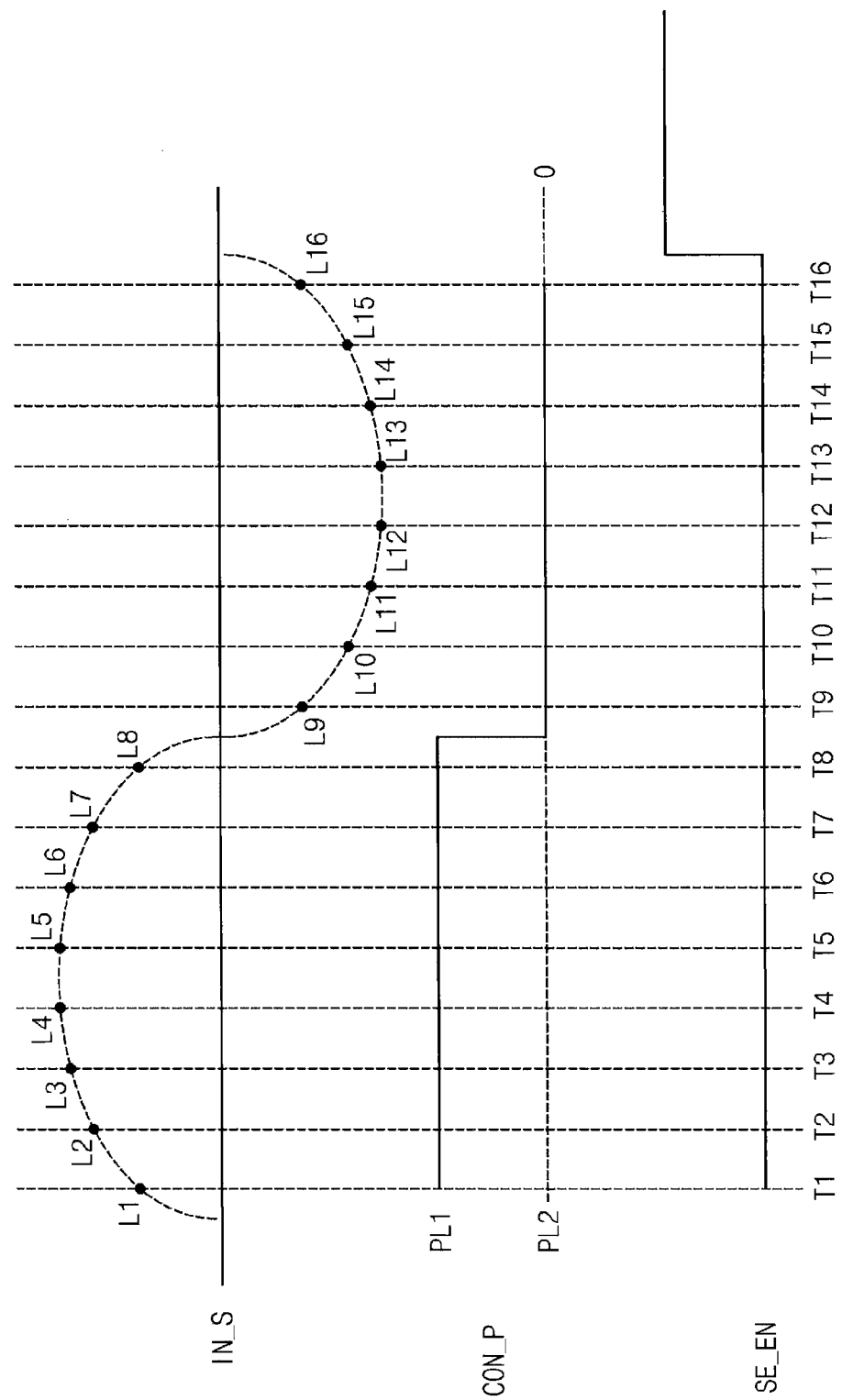

FIGS. 10 and 11 are graphs of an operation of a peak comparator included in the data generating device of FIG. 2 according to an embodiment of the present disclosure.

Referring to FIG. 10, the result value calculator 100 may generate the result values RE_V by multiplying the input signal IN_S and the predetermined convolution pattern CON_P. When an original signal that is transmitted from a transmitter is 0, the input signal IN_S may only include noise. For example, a noise level in a first time T1 may be a first noise level NL1. When the noise level in the first time T1 is the first noise level NL1, the input signal IN_S in the first time T1 may be the first noise level NL1. In addition, a noise level in a second time T2 may be a second noise level NL2. When the noise level in the second time T2 is the second noise level NL2, the input signal IN_S in the second time T2 may be the second noise level NL2. In the same manner, a noise level in a sixteenth time T16 may be a sixteenth noise level NL16. When the noise level in the sixteenth time T16 is the sixteenth noise level NL16, the input signal IN_S in the sixteenth time T16 may be the sixteenth noise level NL16. The convolution pattern CON_P may include a first pattern interval PT11 and a second pattern interval PT12. For example, a first time T1 to an eighth time T8 may be included in the first pattern interval PT11. A ninth time T9 to a sixteenth time T16 may be included in the second pattern interval PT12. During the first pattern interval PT11, the convolution pattern CON_P may be greater than 0. During the second pattern interval PT12, the convolution pattern CON_P may be equal to 0.

For example, the noise threshold value NT_V may be 100. During the first pattern interval PT11, the level of the convolution pattern CON_P may be 2. A sum of the input signal IN_S during the first pattern interval PT11 may be the value that is a sum of the input signals IN_S in the first time T1 to eighth time T8. The sum of the input signal IN_S during the first pattern interval PT11 may be 10. When the sum of the input signal IN_S during the first pattern interval PT11 is 10, the result value RE_V that is generated by multiplying the input signal IN_S and the convolution pattern CON_P may be 20. When the result value RE_V that is generated by multiplying the input signal IN_S and the convolution pattern CON_P is 20, the result value RE_V may be less than the noise threshold value NT_V. When the result value RE_V is less than the noise threshold value NT_V, the searcher enable signal SE_EN may be deactivated by the peak comparator 200.

Referring to FIG. 11, when the original signal is not 0, the input signal IN_S may include the original signal and noise. For example, the input signal IN_S in the first time T1 may be the first level L1. In addition, the input signal IN_S in the second time T2 may be the second level L2. In the same manner, the input signal IN_S in the sixteenth time T16 may be the sixteenth level L16. The convolution pattern CON_P may include a first pattern interval PT11 and a second pattern interval PT12. For example, a first time T1 to an eighth time T8 may be included in the first pattern interval PT11. A ninth time T9 to a sixteenth time T16 may be included in the second pattern interval PT12. During the first pattern interval PT11, the convolution pattern CON_P may be greater than 0. During the second pattern interval PT12, the convolution pattern CON_P may be equal to 0.

For example, the noise threshold value NT_V may be 100. During the first pattern interval PT11, the level of the convolution pattern CON_P may be 2. The sum of the input signal IN_S during the first pattern interval PT11 may be the value that is the sum of the input signals IN_S in the first time T1 to the eighth time T8. The sum of the input signal IN_S during the first pattern interval PT11 may be 70. When the sum of the input signal IN_S during the first pattern interval PT11 is 70, the result value RE_V that is generated by multiplying the input signal IN_S and the convolution pattern CON_P may be 140. When the result value RE_V that is generated by multiplying the input signal IN_S and the convolution pattern CON_P is 140, the result value RE_V may be greater than the noise threshold value NT_V. When the result value RE_V is greater than the noise threshold value NT_V, the searcher enable signal SE_EN may be activated by the peak comparator 200. The method of generating data according to an embodiment of the present disclosure may increase the reception performance by providing the result data RE_D corresponding to the input signal IN_S based on the data determiner enable signal DD_EN, the input signal IN_S and the filter mask pattern MSK_P.

Figure 12:
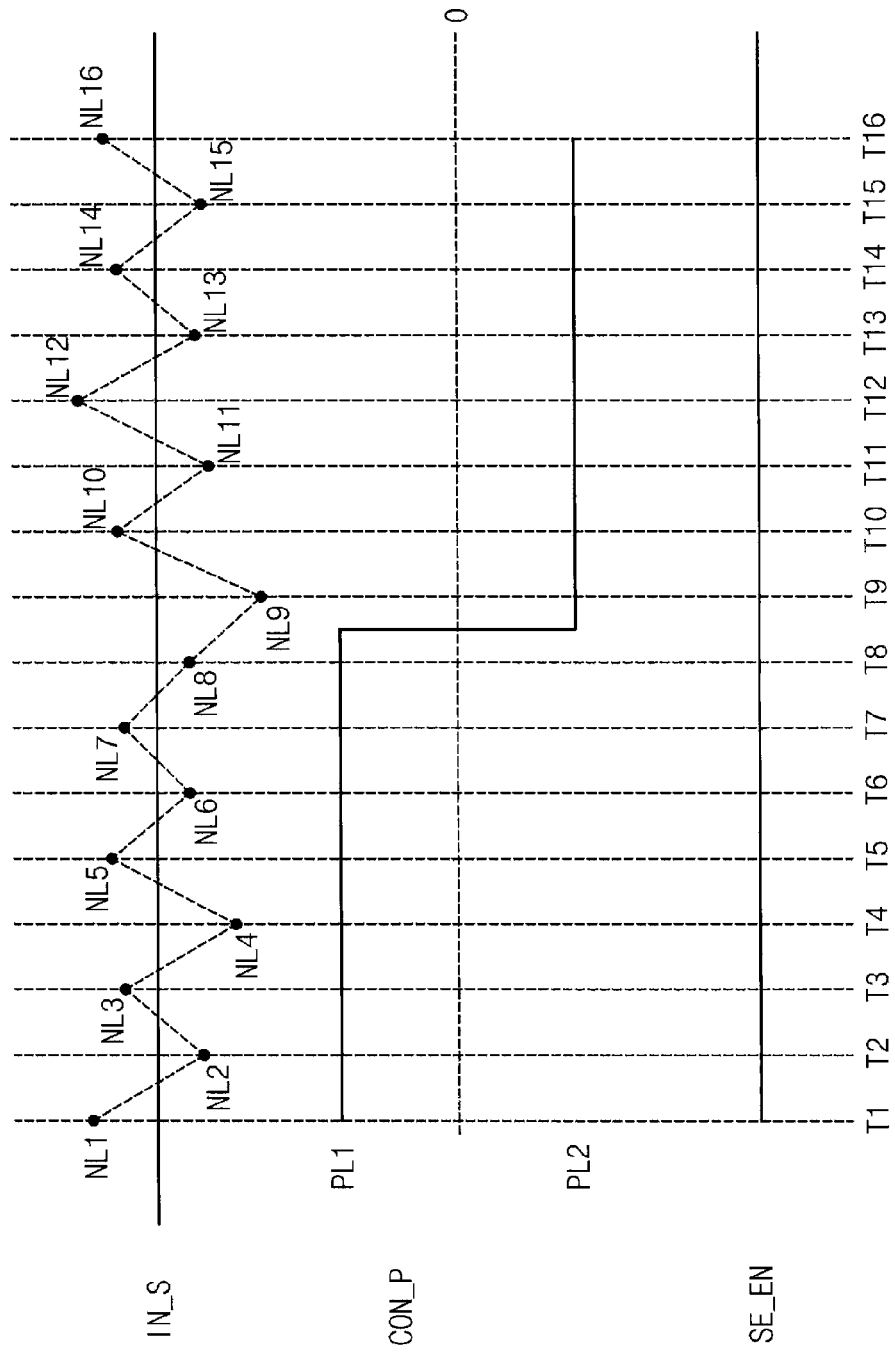
FIGS. 12 and 13 are graphs of an operation of a peak comparator included in the data generating device of FIG. 2 according to an embodiment of the present disclosure.
Figure 13:
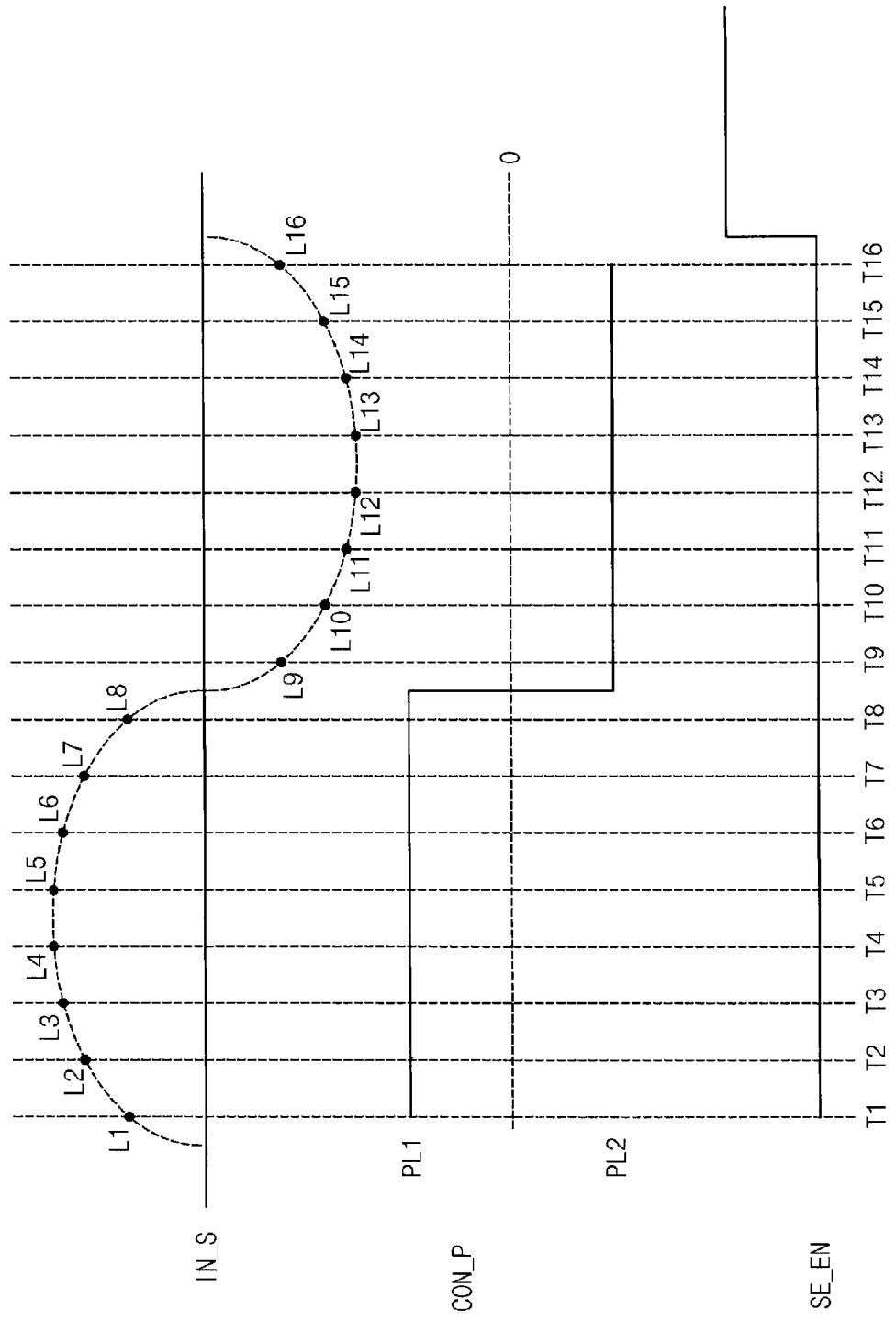

FIGS. 12 and 13 are graphs of an operation of a peak comparator included in the data generating device of FIG. 2 according to an embodiment of the present disclosure.

Referring to FIG. 12, the result value calculator 100 may generate the result values RE_V by multiplying the input signal IN_S and the predetermined convolution pattern CON_P. When original signal is 0, the input signal IN_S may only include noise. For example, a noise level in a first time T1 may be a first noise level NL1. When the noise level in the first time T1 is the first noise level NL1, the input signal IN_S in the first time T1 may be the first noise level NL1. In addition, a noise level in a second time T2 may be a second noise level NL2. When the noise level in the second time T2 is the second noise level NL2, the input signal IN_S in the second time T2 may be the second noise level NL2. In the same manner, a noise level in a sixteenth time T16 may be a sixteenth noise level NL16. When the noise level in the sixteenth time T16 is the sixteenth noise level NL16, the input signal IN_S in the sixteenth time T16 may be the sixteenth noise level NL16. The convolution pattern CON_P may include the first pattern interval PT11 and the second pattern interval PT12. For example, the first time T1 to the eighth time T8 may be included in the first pattern interval PT11. The ninth time T9 to the sixteenth time 116 may be included in the second pattern interval PT12. During the first pattern interval PT11, the convolution pattern CON_P may be greater than 0. During the second pattern interval PT12, the convolution pattern CON_P may be less than 0.

For example, the noise threshold value NT_V may be 200. During the first pattern interval PT11, the level of the convolution pattern CON_P may be 2. During the second pattern interval PT12, the level of the convolution pattern CON_P may be −2. The sum of the input signal IN_S during the first pattern interval PT11 may be the value that is the sum of the input signals IN_S in the first time T1 to the eighth time T8. The sum of the input signal IN_S during the second pattern interval PT12 may be the value that is the sum of the input signals IN_S in the ninth time T9 to the sixteenth time T16. The sum of the input signal IN_S during the first pattern interval PT11 may be 10. The sum of the input signal IN_S during the second pattern interval PT12 may be −10. When the sum of the input signal IN_S during the first pattern interval PT11 is 10 and the sum of the input signal IN_S during the second pattern interval PT12 is −10, the result value RE_V that is generated by multiplying the input signal IN_S and the convolution pattern CON_P may be 40. When the result value RE_V that is generated by multiplying the input signal IN_S and the convolution pattern CON_P is 40, the result value RE_V may be less than the noise threshold value NT_V. When the result value RE_V is less than the noise threshold value NT_V, the searcher enable signal SE_EN may be deactivated by the peak comparator 200.

Referring to FIG. 13, when the original signal is not 0, the input signal IN_S may include the original signal and noise. For example, the input signal IN_S in the first time T1 may be the first level L1. In addition, the input signal IN_S in the second time T2 may be the second level L2. In the same manner, the input signal IN_S in the sixteenth time T16 may be the sixteenth level L16. The convolution pattern CON_P may include the first pattern interval PT11 and the second pattern interval PT12. For example, the first time T1 to the eighth time T8 may be included in the first pattern interval PT11. The ninth time T9 to the sixteenth time T16 may be included in the second pattern interval PT12. During the first pattern interval PT11, the convolution pattern CON_P may be greater than 0. During the second pattern interval PT12, the convolution pattern CON_P may be less than 0.

For example, the noise threshold value NT_V may be 200. During the first pattern interval PT11, the level of the convolution pattern CON_P may be 2. During the second pattern interval PT12, the level of the convolution pattern CON_P may be −2. The sum of the input signal IN_S during the first pattern interval PT11 may be the value that is the sum of the input signals IN_S in the first time T1 to the eighth time T8. The sum of the input signal IN_S during the second pattern interval PT12 may be the value that is the sum of the input signals IN_S in the ninth time T9 to the sixteenth time T16. The sum of the input signal IN_S during the first pattern interval PT11 may be 70. The sum of the input signal IN_S during the second pattern interval P112 may be −70. When the sum of the input signal IN_S during the first pattern interval PT11 is 70 and the sum of the input signal IN_S during the second pattern interval PT12 is −70, the result value RE_V that is generated by multiplying the input signal IN_S and the convolution pattern CON_P may be 280. When the result value RE_V that is generated by multiplying the input signal IN_S and the convolution pattern CON_P is 280, the result value RE_V may be greater than the noise threshold value NT_V. When the result value RE_V is greater than the noise threshold value NT_V, the searcher enable signal SE_EN may be activated by the peak comparator 200. The method of generating data according to an embodiment of the present disclosure may increase the reception performance by providing the result data RE_D corresponding to the input signal IN_S based on the data determiner enable signal DD_EN, the input signal IN_S and the filter mask pattern MSK_P.

Figure 14:
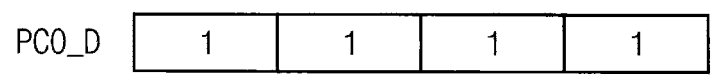
FIG. 14 is a diagram illustrating an output of a peak comparator included in the data generating device of FIG. 2 according to an embodiment of the present disclosure.

FIG. 14 is a diagram illustrating an output of a peak comparator included in the data generating device of FIG. 2 according to an embodiment of the present disclosure.

Referring to FIGS. 1 and 14, when the result value RE_V is greater than the noise threshold value NT_V that is stored in the peak comparator 200, the searcher enable signal SE_EN may be activated. When the searcher enable signal SE_EN is activated, the peak comparator 200 may provide the peak comparator output data PCO_D corresponding to the result value RE_V. For example, the peak comparator output data PCO_D corresponding to the result value RE_V may be 1111. When the first peak value P1 is greater than the noise threshold value NT_V, the searcher enable signal SE_EN is activated by the peak comparator 200. When the searcher enable signal SE_EN is activated, the peak comparator 200 may provide 1111 to the start pattern searcher 300. 1111 may be the peak comparator output data PCO_D corresponding to the result value RE_V.

Figure 15:
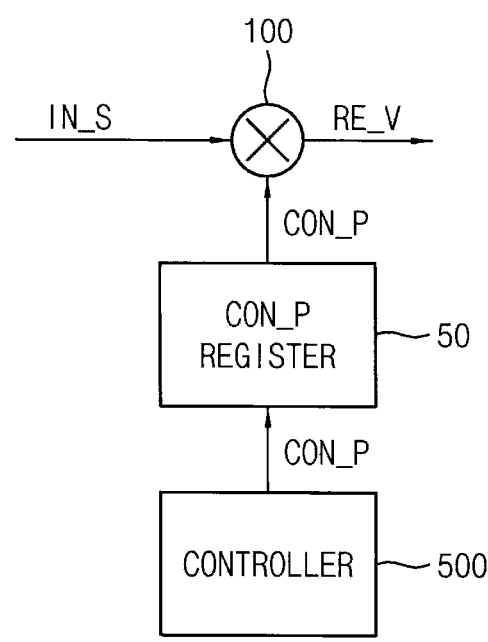
FIG. 15 is a block diagram of a convolution pattern that is stored in a convolution pattern register according to an embodiment of the present disclosure.

FIG. 15 is a block diagram of a convolution pattern that is stored in a convolution pattern register according to an embodiment of the present disclosure.

Referring to FIG. 15, the result value calculator 100 may generate result values RE_V by multiplying an input signal IN_S and a predetermined convolution pattern CON_P. The convolution pattern CON_P may be stored in a convolution pattern register 50 and the convolution pattern CON_P may be controlled by a controller 500. The controller 500 may control a length of the first pattern interval PT11 and a length of the second pattern interval PT12 included in the convolution pattern CON_P that is provided to the result value calculator 100. The controller 500 may be a central processing unit that controls the data generating device 10. For example, the controller 500 may control a value of the convolution pattern register 50 to decrease the first pattern interval PT11. When the controller 500 decreases the first pattern interval PT11 of the convolution pattern CON_P, the second pattern interval PT12 of the convolution pattern CON_P may be increased. In addition, the controller 500 may control the value of the convolution pattern register 50 to increase the first pattern interval PT11. When the controller 500 increases the first pattern interval PT11 of the convolution pattern CON_P, the second pattern interval PT12 of the convolution pattern CON_P may be decreased. In addition, the controller 500 may control the value of the convolution pattern register 50 to decrease the first pattern interval PT11 and the second pattern interval PT12.

The level of the first pattern interval Pill and the second pattern interval PT12 of the convolution pattern CON_P that is provided to the result value calculator 100 may be controlled. For example, the controller 500 may control the value of the convolution pattern register 50 to control the level of the first pattern interval PT11. In addition, the controller 500 may control the value of the convolution pattern register 50 to control the level of the second pattern interval PT12.

Figures 16, 17:
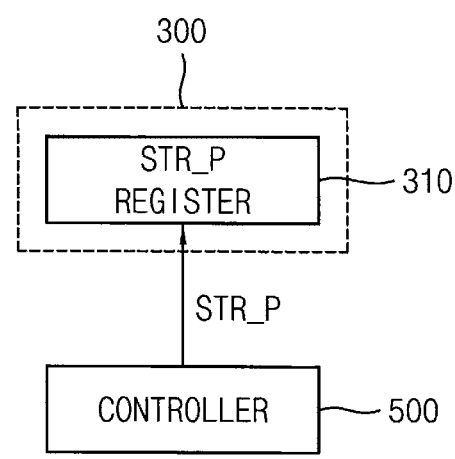
FIG. 16 is a diagram illustrating a start pattern and a peak comparator output according to an embodiment of the present disclosure.
FIG. 17 is a block diagram of a start pattern that is stored in a start pattern register according to an embodiment of the present disclosure.

FIG. 16 is a diagram illustrating a start pattern and a peak comparator output data PCO_D according to an embodiment of the present disclosure.

Referring to FIGS. 1 and 16, the data generating device 10 may include the result value calculator 100, the peak comparator 200, the start pattern searcher 300 and the data determiner 400. The result value calculator 100 may generate result values RE_V by multiplying the input signal IN_S and the predetermined convolution, pattern CON_P. The peak comparator 200 provides a searcher enable signal SE_EN and peak comparator output data PCO_D based on the result values RE_V that are generated by multiplying an input signal IN_S having a plurality of levels and the predetermined convolution pattern CON_P. For example, when the result value RE_V is greater than the noise threshold value NT_V that is stored in the peak comparator 200, the searcher enable signal SE_EN may be activated.

When the searcher enable signal SE_EN is activated, the peak comparator 200 may provide the peak comparator output data PCO_D corresponding to the result value RE_V. For example, the peak comparator output data PCO_D corresponding to the result value RE_V may be 1111. When the first peak value P1 is greater than the noise threshold value NT_V, the searcher enable signal SE_EN is activated by the peak comparator 200. When the searcher enable signal SE_EN is activated, the peak comparator 200 may provide 1111 to the start pattern searcher 300. 1111 may be the peak comparator output data PCO_D corresponding to the result value RE_V. In an embodiment of the present disclosure, when the searcher enable signal SE_EN is activated and the peak comparator output data PCO_D is equal to the predetermined start pattern STR_P, the data determiner enable signal DD_EN may be activated by the start pattern searcher 300. For example, the start pattern STR_P may be 1111. The searcher enable signal SE_EN may be activated and 1111 that is the peak comparator output data PCO_D may be equal to 1111 that is the predetermined start pattern STR_P. In this case, because the peak comparator output data PCO_D is equal to the predetermined start pattern STR_P, the data determiner enable signal DD_EN may be activated by the start pattern searcher 300. The method of generating data according to an embodiment of the present disclosure may increase the reception performance by providing the result data RE_D corresponding to the input signal IN_S based on the data determiner enable signal DD_EN, the input signal IN_S and the filter mask pattern MSK_P.

FIG. 17 is a block diagram of a start pattern that is stored in a start pattern register according to an embodiment of the present disclosure.

Referring to FIG. 17, a start pattern searcher 300 may include a start pattern register 310. The start pattern STR_P may be stored in a start pattern register 310 and the start pattern STR_P may be controlled by a controller 500. The controller 500 may control a length of the start pattern STR_P. The controller 500 may be a central processing unit that controls the data generating device 10. For example, the controller 500 may decrease a value of the start pattern register 310 to decrease the length of the start pattern STR_P. The controller 500 may increase a value of the start pattern register 310 to increase the length of the start pattern STR_P. The controller 500 may control the value of the start pattern STR_P. For example, the controller 500 may increase the value of the start pattern register 310 to increase the value of the start pattern STR_P. The controller 500 may decrease the value of the start pattern register 310 to decrease the value of the start pattern STR_P.

Figure 18:
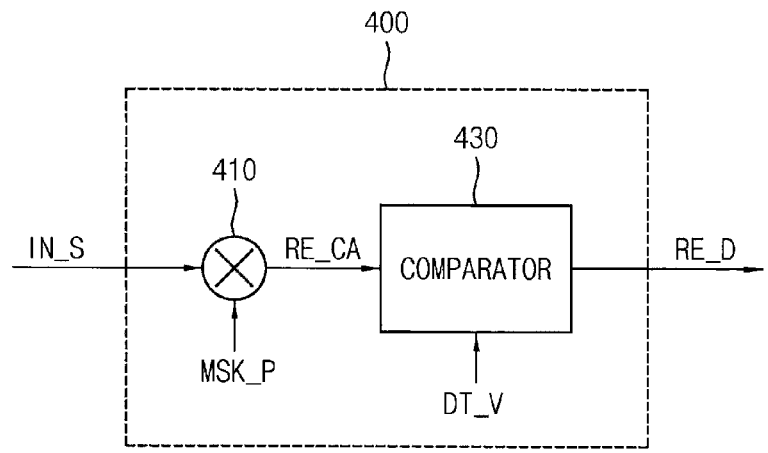
FIG. 18 is a block diagram of a data determiner included in the data generating device of FIG. 2 according to an embodiment of the present disclosure.

FIG. 18 is a block diagram of a data determiner included in the data generating device of FIG. 2 according to an embodiment of the present disclosure.

Referring to FIGS. 1 and 18, a data generating device 10 may include a result value calculator 100, a peak comparator 200, a start pattern searcher 300 and a data determiner 400. The result value calculator 100 may generate result values RE_V by multiplying an input signal IN_S and a predetermined convolution pattern CON_P. In a method of generating data, a peak comparator 200 provides a searcher enable signal SE_EN and peak comparator output data PCO_D based on the result values RE_ V that are generated by multiplying an input signal IN_S having a plurality of levels and the predetermined convolution pattern CON_P. A start pattern searcher 300 provides a data determiner enable signal DD_EN by comparing the peak comparator output data PCO_D and a predetermined start pattern STR_P according to the searcher enable signal SE_EN. A data determiner 400 provides a result data RE_D corresponding to the input signal IN_S based on the data determiner enable signal DD_EN, the input signal IN_S and a predetermined filter mask pattern MSK_P. The data determiner 400 may include a calculator 410 and a comparator 430. The calculator 410 may provide a calculation result RE_CA by multiplying the input signal IN_S and the filter mask pattern MSK_P. The comparator 430 may provide a result data RE_D by comparing the calculation result RE_ CA and a predetermined data threshold value DT_V. The method of generating data according to an embodiment of the present disclosure may increase the reception performance by providing the result data RE_D corresponding to the input signal IN_S based on the data determiner enable signal DD_EN, the input signal IN_S and the filter mask pattern MSK_P.

Figure 19:
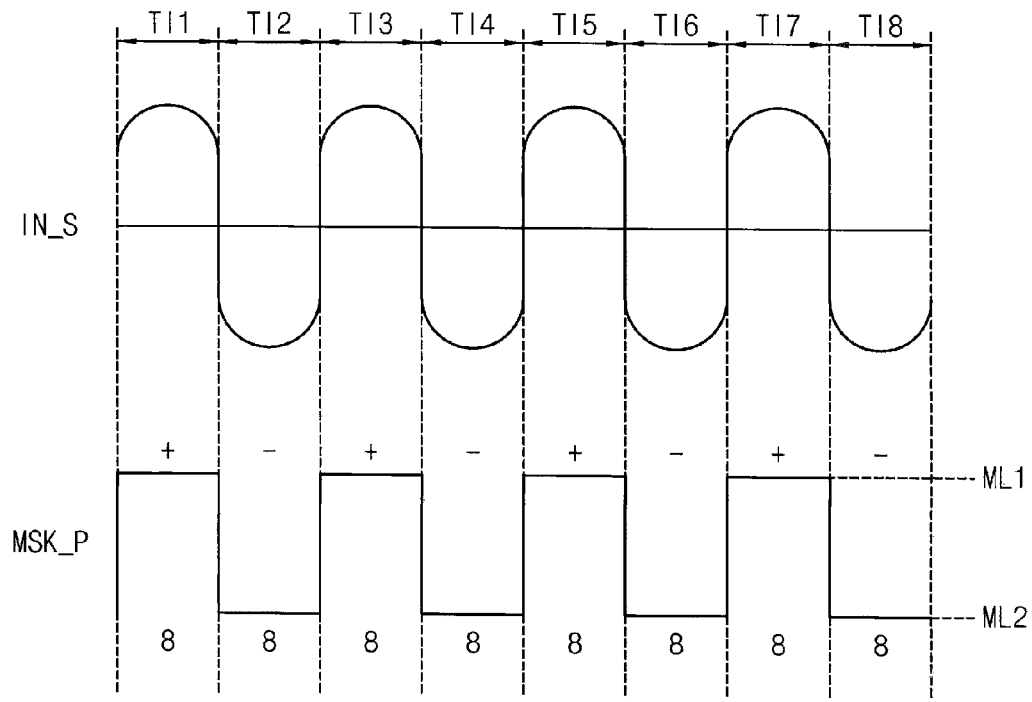
FIG. 19 is a graph of an input signal and a filter mask pattern that are provided to the data generating device of FIG. 2 according to an embodiment of the present disclosure.

FIG. 19 is a graph of an input signal and a filter mask pattern that are provided to the data generating device of FIG. 2 according to an embodiment of the present disclosure.

Referring to FIG. 19, the filter mask pattern MSK_P may include a plurality of odd number time intervals and a plurality of even number time intervals. For example, the plurality of odd number time intervals may include a first time interval T11, a third time interval T13, a fifth time interval T15 and a seventh time interval T17. The plurality of even number time intervals may include a second time interval T12, a fourth time interval T14, a sixth time interval T16 and an eighth time interval T18. The plurality of odd number time intervals may be a first mask level ML1. For example, during the first time interval T11, the third time interval T13, the fifth time interval T15 and the seventh time interval T17, the level of the filter mask pattern MSK_P may be the first mask level ML1. The first mask level ML1 may be greater than 0. In addition, the plurality of even number time intervals may be a second mask level ML2. For example, during the second time interval T12, the fourth time interval T14, the sixth time interval T16 and the eighth time interval T18, the level of the filter mask pattern MSK_P may be the second mask level ML2. The second mask level ML2 may be less than 0.

In an example embodiment, the filter mask pattern MSK_P may be in synchronization with the input signal IN_S. When the searcher enable signal SE_EN is activated and the peak comparator output data PCO_D is equal to the predetermined start pattern STR_P, the data determiner enable signal DD_EN may be activated by the start pattern searcher 300. When the data determiner enable signal DD_EN is activated by the start pattern searcher 300, the filter mask pattern MSK_P may be in synchronization with the input signal IN_S to increase the reception performance. When the filter mask pattern MSK_P is in synchronization with the input signal IN_S, the calculator 410 may provide the accurate calculation result RE_CA by multiplying the input signal IN_S and the filter mask pattern MSK_P. The method of generating data according to according to an embodiment of the present disclosure may increase the reception performance by providing the result data RE_D corresponding to the input signal IN_S based on the data determiner enable signal DD_EN, the input signal IN_S and the filter mask pattern MSK_P.

Figure 20:
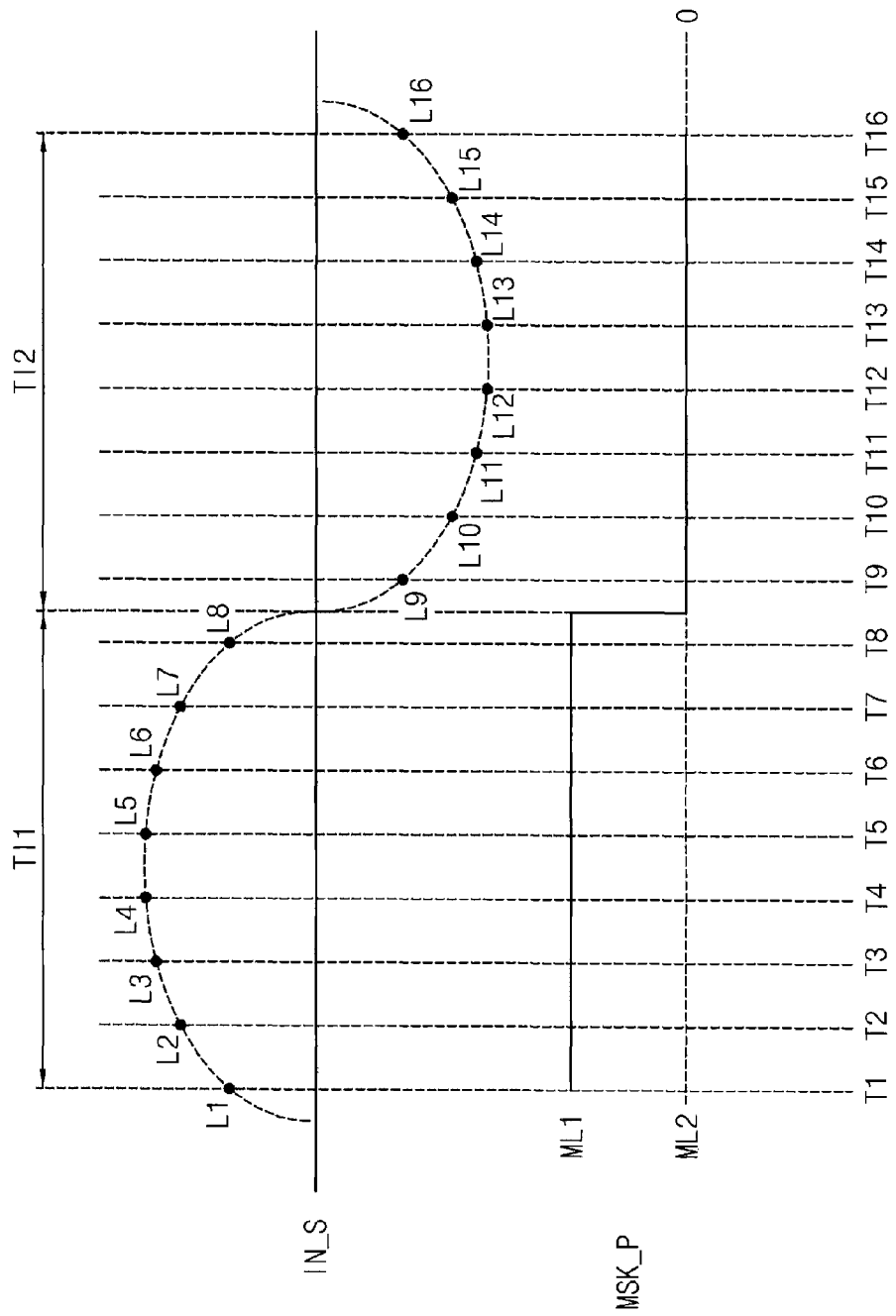
FIG. 20 is a graph of an operation of a data determiner included in the data generating device of FIG. 2 according to an embodiment of the present disclosure.
Figure 21:
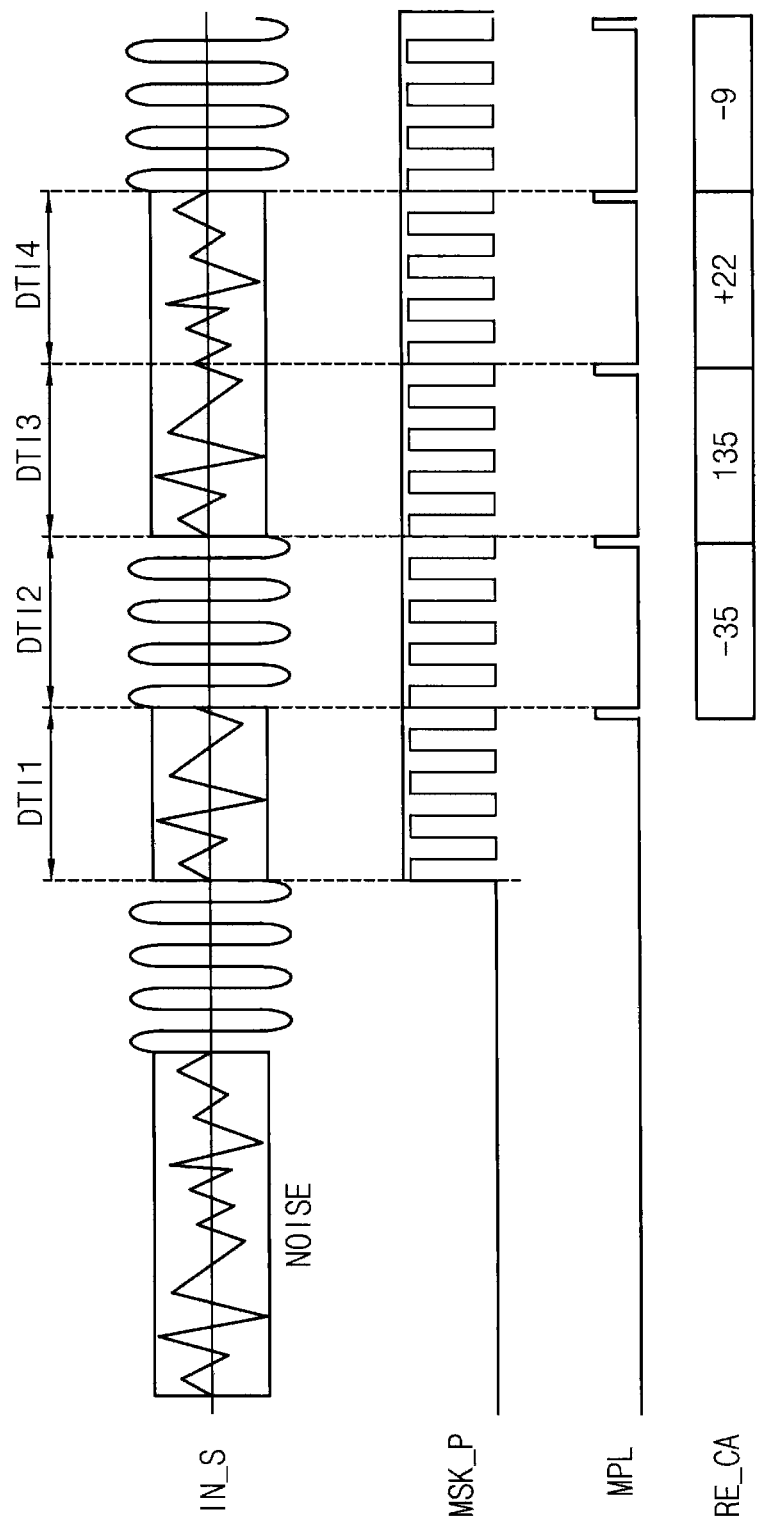
FIG. 21 is a graph of an operation of a calculator included in the data determiner of FIG. 18 according to an embodiment of the present disclosure.
Figure 22:
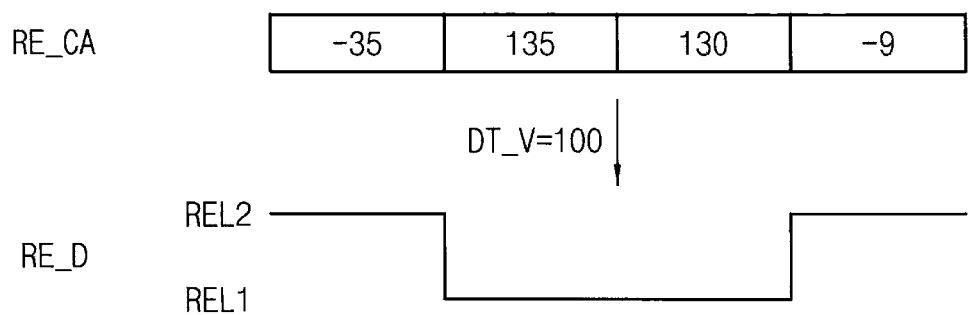
FIG. 22 is a diagram of an operation of a comparator included in the data determiner of FIG. 18 according to an embodiment of the present disclosure.

FIG. 20 is a graph of an operation of a data determiner included in the data generating device of FIG. 2 according to an embodiment of the present disclosure, FIG. 21 is a graph of an operation of a calculator included in the data determiner of FIG. 18 according to an embodiment of the present disclosure and FIG. 22 is a diagram of an operation of a comparator included in the data determiner of FIG. 18 according to an embodiment of the present disclosure.

Referring to FIGS. 20 to 22, when the original signal that is transmitted from the transmitter is not 0, the input signal IN_S may include the original signal and noise. For example, the input signal IN_S in the first time T1 may be the first level L1. In addition, the input signal IN_S in the second time T2 may be the second level L2. In the same manner, the input signal IN_S in the sixteenth time T16 may be the sixteenth level L16. The filter mask pattern MSK_P may include a first time interval T11 and a second time interval T12. For example, a first time T1 to an eighth time T8 may be included in the first time interval T11. A ninth time T9 to a sixteenth time T16 may be included in the second time interval T12. During the first time interval T11, the filter mask pattern MSK_P may be greater than 0. During the second time interval T12, the filter mask pattern MSK_P may be equal to 0 or may be less than 0.

For example, the noise threshold value NT_V may be 100. During the odd number time intervals, the level of the filter mask pattern MSK_P may be 2. A sum of the input signal IN_S during the odd number time intervals may be the value that is a sum of the input signals IN_S in the first time T1 to the eighth time T8 of the first time interval T11, the input signals IN_S in the first time T1 to the eighth time T8 of the third time interval T13, the input signals IN_S in the first time T1 to the eighth time T8 of the fifth time interval T15 and the input signals IN_S in the first time T1 to the eighth time T8 in the seventh time interval T17. The sum of the input signals IN_S during the odd number time intervals may be 70. When the sum of the input signals IN_S during the odd number time interval is 70, the calculation result RE_CA that is generated by multiplying the input signal IN_S and the filter mask pattern MSK_P may be 140. When the calculation result RE_CA that is generated by multiplying the input signal IN_S and the filter mask pattern MSK_P is 140, the absolute value of the calculation result RE_CA may be greater than the data threshold value DT_V. When the absolute value of the calculation result RE_CA is greater than the data threshold value DT_V, the comparator 430 may provide a first result level REL1 as the result data RE_D. The first result level REL1 may be 0.

For example, the noise threshold value NT_V may be 200. During the odd number time intervals, the level of the filter mask pattern MSK_P may be 2. During the even number time intervals, the level of the filter mask pattern MSK_P may be −2. The sum of the input signal IN_S during the odd number time intervals may be the value that is a sum of the input signals IN_S in the first time T1 to the eighth time T8 of the first time interval T11, the input signals IN_S in the first time T1 to the eighth time T8 of the third time interval T13, the input signals IN_S in the first time T1 to the eighth time T8 of the fifth time interval T15 and the input signals IN_S in the first time T1 to the eighth time T8 in the seventh time interval T17. The sum of the input signal IN_S during the even number time intervals may be the value that is a sum of the input signals IN_S in the first time T1 to the eighth time T8 of the second time interval T12, the input signals IN_S in the first time T1 to the eighth time T8 of the fourth time interval T14, the input signals IN_S in the first time T1 to the eighth time T8 of the sixth time interval T16 and the input signals IN_S in the first time T1 to the eighth time T8 in the eighth time interval T18.

The sum of the input signals IN_S during the odd number time intervals may be 70. The sum of the input signals IN_S during the even number time intervals may be −70. When the sum of the input signals IN_S during the odd number time interval is 70 and the sum of the input signals IN_S during the even number time interval is −70. The calculation result RE_CA that is generated by multiplying the input signal IN_S and the filter mask pattern MSK_P may be 280. When the calculation result RE_CA that is generated by multiplying the input signal IN_S and the filter mask pattern MSK_P is 280, the absolute value of the calculation result RE_CA may be greater than the data threshold value DT_V. When the absolute value of the calculation result RE_CA is greater than the data threshold value DT_V, the comparator 430 may provide a first result level REL1 as the result data RE_D. The first result level REL1 may be 0.

For example, when the noise threshold value NT_V is 100 and the calculation result RE_CA is −35, the absolute value of the calculation result RE_CA may be less than the data threshold value DT_V. When the absolute value of the calculation result RE_CA is less than the data threshold value DT_V, the comparator 430 may provide a second result level REL2 as the result data RE_D. The second result level REL2 may be 1. In addition, when the calculation result RE_CA is 135, the absolute value of the calculation result RE_CA may be greater than the data threshold value DT_V. When the absolute value of the calculation result RE_CA is greater than the data threshold value DT_V, the comparator 430 may provide the first result level REL1 as the result data RE_D. In addition, when the calculation result RE_CA is 130, the absolute value of the calculation result RE_CA may be greater than the data threshold value DT_V. When the absolute value of the calculation result RE_CA is greater than the data threshold value DT_V, the comparator 430 may provide the first result level REL1 as the result data RE_D. In addition, when the calculation result RE_CA is −9, the absolute value of the calculation result RE_CA may be less than the data threshold value DT_V. When the absolute value of the calculation result RE_CA is less than the data threshold value DT_V, the comparator 430 may provide the second result level REL2 as the result data RE_D. In this case, the result data RE_D may be 1001.

In an embodiment of the present disclosure, when an absolute value of the calculation result RE_CA is greater than the data threshold value DT_V, the comparator 430 may provide a first result level REL1 as the result data RE_D. When the absolute value of the calculation result RE_CA is less than the data threshold value DT_V, the comparator 430 may provide a second result level REL2 as the result data RE_D. The method of generating data according to an embodiment of the present disclosure may increase the reception performance by providing the result data RE_D corresponding to the input signal IN_S based on the data determiner enable signal DD_EN, the input signal IN_S and the filter mask pattern MSK_P.

Figure 23:
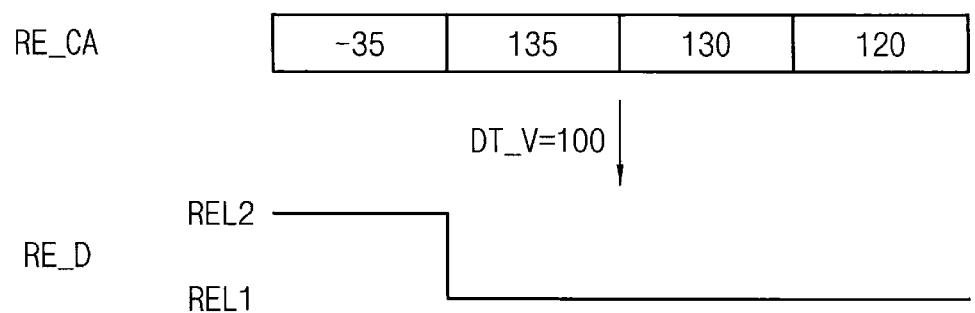
FIGS. 23 and 24 are diagrams of a stop operation of the data determiner of FIG. 18 according to an embodiment of the present disclosure.
Figure 24:
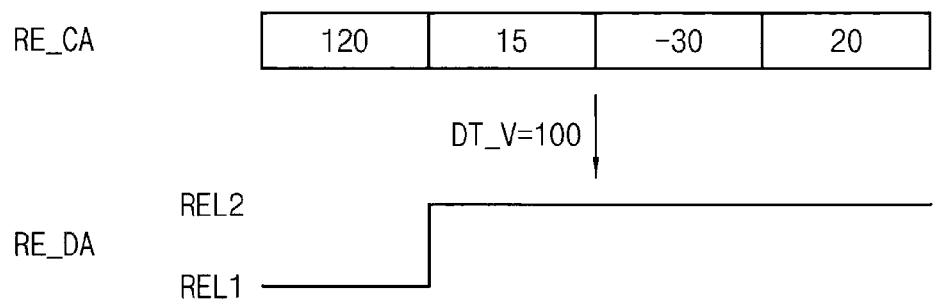

FIGS. 23 and 24 are diagrams of a stop operation of the data determiner of FIG. 18 according to an embodiment of the present disclosure.

Referring to FIG. 23, when the noise threshold value NT_V is 100 and the calculation result RE_CA is −35, the absolute value of the calculation result RE_CA may be less than the data threshold value DT_V. When the absolute value of the calculation result RE_CA is less than the data threshold value DT_V, the comparator 430 may provide the second result level REL2 as the result data RE_D. The second result level REL2 may be 1. In addition, when the calculation result RE_CA is 135, the absolute value of the calculation result RE_CA may be greater than the data threshold value DT_V. When the absolute value of the calculation result RE_CA is greater than the data threshold value DT_V, the comparator 430 may provide the first result level REL1 as the result data RE_D. In addition, when the calculation result RE_CA is 130, the absolute value of the calculation result RE_CA may be greater than the data threshold value DT_V. When the absolute value of the calculation result RE_CA is greater than the data threshold value DT_V, the comparator 430 may provide the first result level REL1 as the result data RE_D. In addition, when the calculation result RE_CA is 120, the absolute value of the calculation result RE_CA may be greater than the data threshold value DT_V. When the absolute value of the calculation result RE_CA is greater than the data threshold value DT_V, the comparator 430 may provide the first result level REL1 as the result data RE_D. In this case, the result data RE_D may be 1000. In this case, "0" included in the result data RE_D may be sequentially repeated more than three times.

Referring to FIG. 24, when the noise threshold value NT_V is 100 and the calculation result RE_CA is 120, the absolute value of the calculation result RE_CA may be greater than the data threshold value DT_V. When the absolute value of the calculation result RE_CA is greater than the data threshold value DT_V, the comparator 430 may provide the first result level REL1 as the result data RE_D. The first result level REL1 may be 0. In addition, when the calculation result RE_CA is 15, the absolute value of the calculation result RE_CA may be less than the data threshold value DT_V. When the absolute value of the calculation result RE_CA is less than the data threshold value DT_V, the comparator 430 may provide the second result level REL2 as the result data RE_D. In addition, when the calculation result RE_CA is −30, the absolute value of the calculation result RE_CA may be less than the data threshold value DT_V. When the absolute value of the calculation result RE_CA is less than the data threshold value DT_V, the comparator 430 may provide the second result level REL2 as the result data RE_D. In addition, when the calculation result RE_CA is 20, the absolute value of the calculation result RE_CA may be less than the data threshold value DT_V. When the absolute value of the calculation result RE_CA is less than the data threshold value DT_V, the comparator 430 may provide the second result level REL2 as the result data RE_D. In this case, the result data RE_D may be 0111. In this case, "1" included in the result data RE_D may be sequentially repeated more than three times.

In an embodiment of the present disclosure, when each of the first result level REL1 and the second result level REL2 is sequentially repeated more than three times, the data determiner 400 may stop providing the result data RE_D. For example, the same result level may not be sequentially repeated more than three times in Manchester coding. When the same result level may not be sequentially repeated more than three times, the data determiner 400 may stop providing the result data RE_D.

Figure 25:
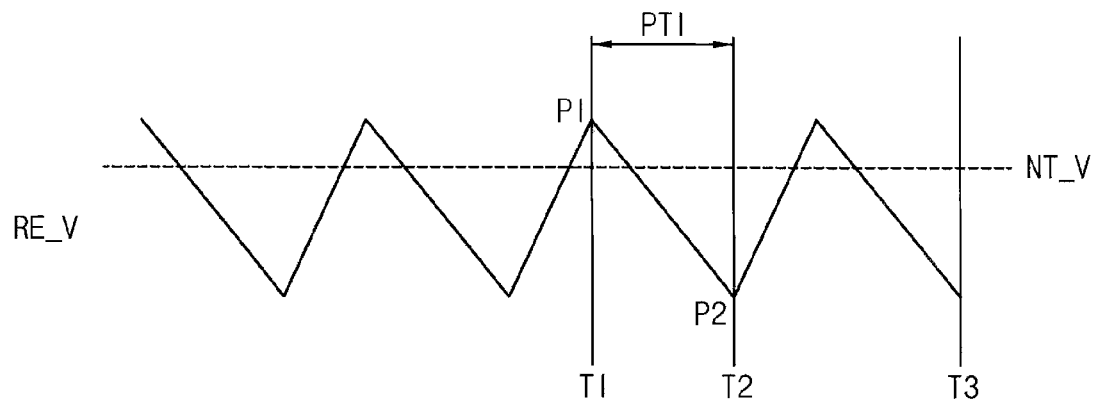
FIG. 25 is a graph of a time when a filter mask pattern is provided to a calculator according to an embodiment of the present disclosure.

FIG. 25 is a graph of a time when a filter mask pattern is provided to a calculator 410 according to an embodiment of the present disclosure.

Referring to FIGS. 19 and 25, the filter mask pattern MSK_P may be in synchronization with the input signal IN_S. When the searcher enable signal SE_EN is activated and the peak comparator output data PCO_D is equal to the predetermined start pattern STR_P, the data determiner enable signal DD_EN may be activated by the start pattern searcher 300. When the data determiner enable signal DD_EN is activated by the start pattern searcher 300, the filter mask pattern MSK_P may be in synchronization with the input signal IN_S to increase the reception performance. When the filter mask pattern MSK_P is in synchronization with the input signal IN_S, the calculator 410 may provide the accurate calculation result RE_CA by multiplying the input signal IN_S and the filter mask pattern MSK_P.

The data determiner 400 may provide the filter mask pattern MSK_P to the calculator 410 based on a time interval among peak values of the result values RE_V in order that the calculator 410 provides the accurate calculation result RE_CA by multiplying the input signal IN_S and the filter mask pattern MSK_P. For example, when the filter mask pattern MSK_P is provided to the calculator 410 in the third time T3, the calculator 410 may provide the accurate calculation result RE_CA by multiplying the input signal IN_S and the filter mask pattern MSK_P. In this case, the time interval among peak values of the result values RE_V may be used to provide the filter mask pattern MSK_P to the calculator 410 in the third time T3. For example, when the result value RE_V in the first time T1 is a first peak P1 and the result value RE_V in the second time T2 is a second peak P2, the time interval PTI among peak values may be a peak time interval PTI. When the time interval among peak values is the peak time interval PTI, the data determiner 400 may provide the filter mask pattern MSK_P to the calculator 410 after three times the peak time interval PTI from the first time T1. The method of generating data according to an embodiment of the present disclosure may increase the reception performance by providing the result data RE_D corresponding to the input signal IN_S based on the data determiner enable signal DD_EN, the input signal IN_S and the filter mask pattern MSK_P.

Figure 26:
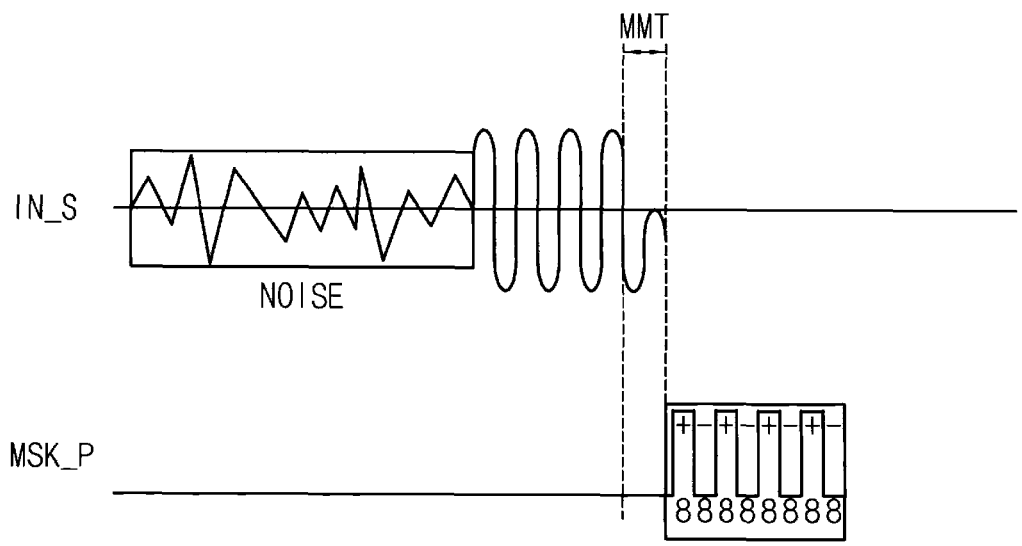
FIG. 26 is a graph of control of time when a filter mask pattern is provided to a calculator according to an embodiment of the present disclosure.
Figure 27:
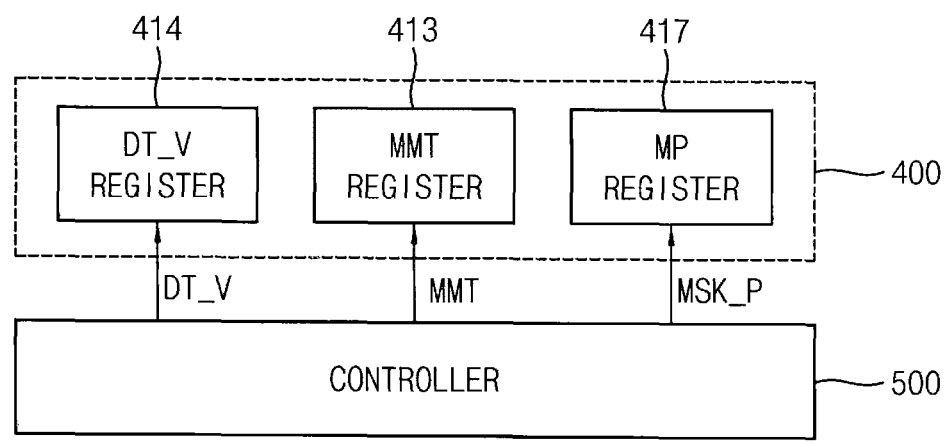
FIG. 27 is a block diagram of a mask matching timer register, a data threshold value register and a mask pattern register included in a data determiner of the data generating device of FIG. 2 according to an embodiment of the present disclosure.

FIG. 26 is a graph of control of time when a filter mask pattern is provided to a calculator according to an embodiment of the present disclosure and FIG. 27 is a block diagram of a mask matching timer register, a data threshold value register and a mask pattern register included in a data determiner of the data generating device of FIG. 2 according to an embodiment of the present disclosure.

Referring to FIGS. 26 and 27, the data determiner 400 may include a data threshold value register 414, a mask matching timer register 413 and a mask pattern register 417. The data threshold value DT_V may be stored in the data threshold value register 414. The data threshold value DT_V may be predetermined. The data threshold value DT_V that is stored in the data threshold value register 414 may be controlled by the controller 500. The controller 500 may be the central processing unit that controls the data generating device 10. The data threshold value DT_V may be changed according to the surrounding environment of the data generating device 10. For example, when the noise in the surroundings of the data generating device 10 increases, the controller 500 may increase the data threshold value DT_V by controlling the data threshold value register 414. When the noise in the surroundings of the data generating device 10 decreases, the controller 500 may decrease the data threshold value DT_V by controlling the data threshold value register 414. In addition, the data threshold value DT_V may be changed according to the ambient temperature of the data generating device 10. When the ambient temperature of the data generating device 10 changes, the controller 500 may control the data threshold value DT_V by controlling the data threshold value register 414.

The filter mask pattern MSK_P may be stored in the mask pattern register 417. The mask pattern may be changed by the controller 500. The controller 500 may control the value of the filter mask pattern MSK_P. For example, the controller 500 may decrease the value of the filter mask pattern register 417 to decrease the value of the filter mask pattern MSK_P. In addition, the controller 500 may increase the value of the filter mask pattern register 417 to increase the value of the filter mask pattern MSK_P.

A time MMT when the filter mask pattern MSK_P is provided to the calculator 410 may be stored in the mask matching timer register 413. The time MMT when the filter mask pattern MSK_P is provided to the calculator 410 may be controlled by the controller 500. For example, the value that is stored in the mask matching timer register 413 may be a first time T1 and the value that is stored in the mask matching timer register 413 may be a second time T2. The first time T1 may be greater than the second time T2. The time MMT when the filter mask pattern MSK_P is provided to the calculator 410 when the value that is stored in the mask matching timer register 413 is the first time T1 may be later than the time MMT when the filter mask pattern MSK_P is provided to the calculator 410 when the value that is stored in the mask matching timer register 413 is the second time T2.

In an embodiment of the present disclosure, the time MMT when the filter mask pattern MSK_P is provided to the calculator 410 may be determined by a timer value that is stored in the mask matching timer register 413.

Figure 28:
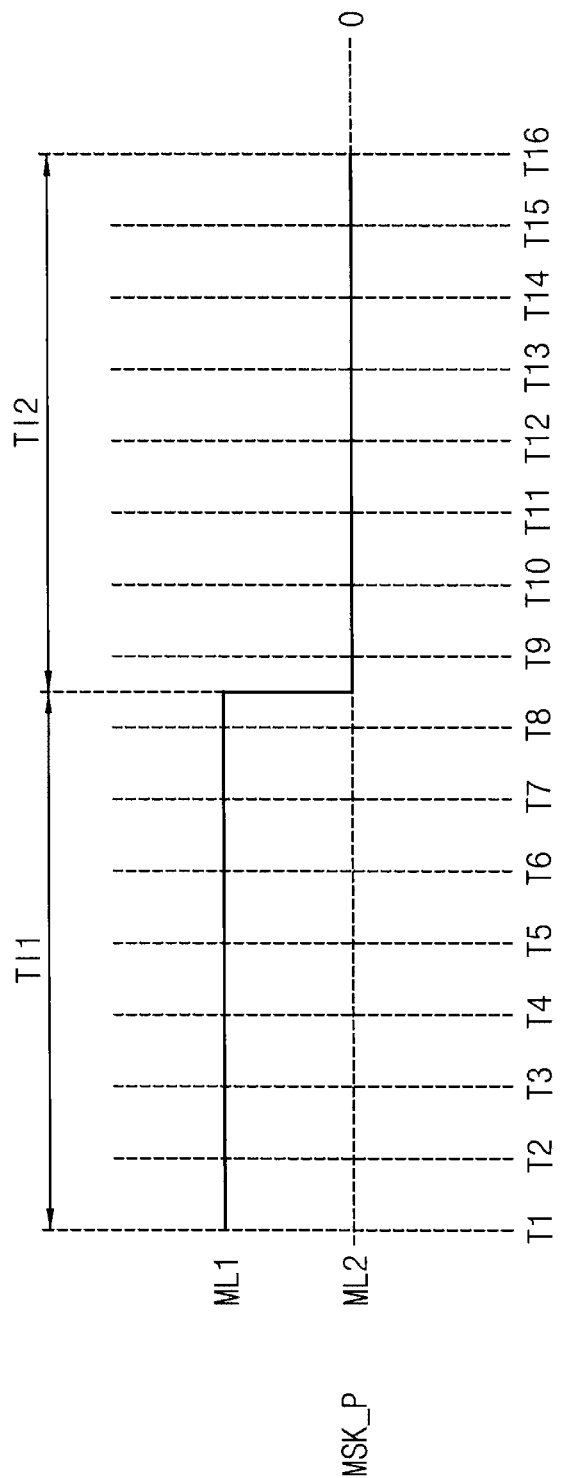
FIG. 28 is a graph of a filter mask pattern that is provided to a data determiner of the data generating device of FIG. 2 according to an embodiment of the present disclosure.

FIG. 28 is a graph of a filter mask pattern that is provided to a data determiner of the data generating device of FIG. 2 according to an embodiment of the present disclosure.

Referring to FIG. 28, a filter mask pattern MSK_P may include a first time interval T11 and a second time interval T12. The first time interval T11 and the second time interval T12 of FIG. 28 may be equal to the first time interval T11 and the second time interval T12 of FIG. 19. For example, the first time T1 to the eighth time T8 may be included in the first time interval TH. The ninth time T9 to the sixteenth time T16 may be included in the second time interval T12. During the first time interval T11, the filter mask pattern MSK_P may be greater than 0. During the second time interval T12, the filter mask pattern MSK_P may be equal to 0. In an embodiment of the present disclosure, a first time interval T11 of the filter mask pattern MSK_P may be a first mask level ML1 and a second time interval T12 of the filter mask pattern MSK_P may be a second mask level ML2. For example, the first mask level ML1 may be greater than 0 and the second mask level ML2 may be equal to 0. The method of generating data according to an embodiment of the present disclosure may increase the reception performance by providing the result data RE_D corresponding to the input signal IN_S based on the data determiner enable signal DD_EN, the input signal IN_S and the filter mask pattern MSK_P.

Figure 29:
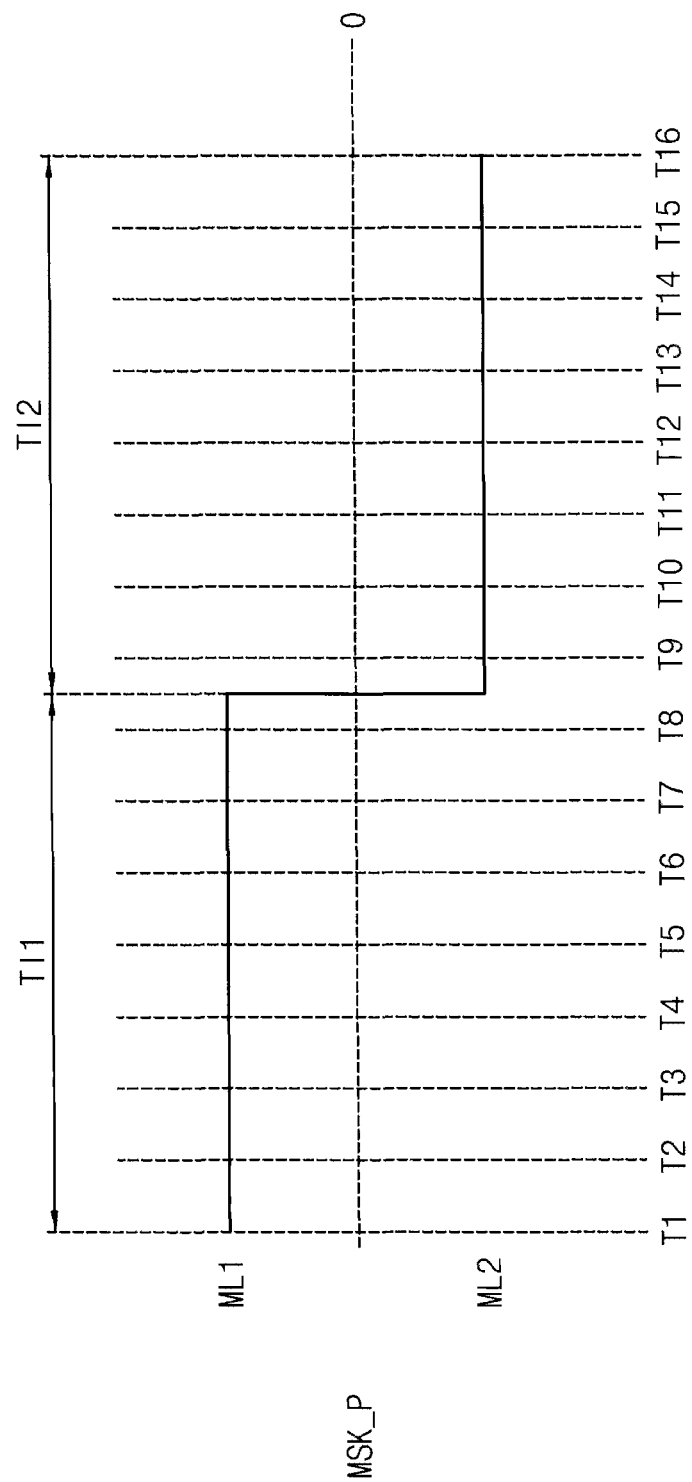
FIG. 29 is a graph of a filter mask pattern that is provided to a data determiner of the data generating device of FIG. 2.

FIG. 29 is a graph of a filter mask pattern that is provided to a data determiner of the data generating device of FIG. 2 according to an embodiment of the present disclosure.

Referring to FIGS. 19 and 29, the filter mask pattern MSK_P may include a first time interval T11 and a second time interval T12. The first time interval T11 and the second time interval T12 of FIG. 28 may be equal to the first time interval T11 and the second time interval T12 of FIG. 19. For example, the first time T1 to the eighth time T8 may be included in the first time interval T11. The ninth time T9 to the sixteenth time T16 may be included in the second time interval T12. During the first time interval T11, the filter mask pattern MSK_P may be greater than 0. During the second time interval T12, the filter mask pattern MSK_P may be less than 0. In an embodiment of the present disclosure, a first time interval T11 of the filter mask pattern MSK_P may be a first mask level ML1 and a second time interval 112 of the filter mask pattern MSK_P may be a second mask level ML2. For example, the first mask level ML1 may be greater than 0 and the second mask level ML2 may be less than 0.

In an embodiment of the present disclosure, the filter mask pattern MSK_P may include a plurality of odd number time intervals and a plurality of even number time intervals. The plurality of odd number time intervals may be a first mask level ML1. The plurality of even number time intervals may be a second mask level ML2. For example, the plurality of odd number time intervals may include a first time interval T11, a third time interval T13, a fifth time interval T15 and a seventh time interval T17. The plurality of even number time intervals may include a second time interval 112, a fourth time interval T14, a sixth time interval 116 and an eighth time interval T18. The plurality of odd number time intervals may be a first mask level ML1. For example, during the first time interval T11, the third time interval T13, the fifth time interval 115 and the seventh time interval T17, the level of the filter mask pattern MSK_P may be the first mask level ML1. The first mask level ML1 may be greater than 0. In addition, the plurality of even number time intervals may be a second mask level ML2. For example, during the second time interval T12, the fourth time interval T14, the sixth time interval 116 and the eighth time interval 118, the level of the filter mask pattern MSK_P may be the second mask level ML2. The second mask level ML2 may be less than 0.

In an embodiment of the present disclosure, the filter mask pattern MSK_P may be in synchronization with the input signal IN_S. When the searcher enable signal SE_EN is activated and the peak comparator output data PCO_D is equal to the predetermined start pattern STR_P, the data determiner enable signal DD_EN may be activated by the start pattern searcher 300. When the data determiner enable signal DD_EN is activated by the start pattern searcher 300, the filter mask pattern MSK_P may be in synchronization with the input signal IN_S to increase the reception performance. When the filter mask pattern MSK_P is in synchronization with the input signal IN_S, the calculator 410 may provide the accurate calculation result RE_CA by multiplying the input signal IN_S and the filter mask pattern MSK_P.

Figure 30:
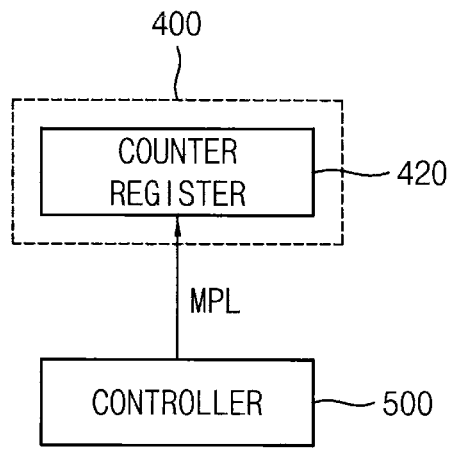
FIG. 30 is a block diagram of a counter register included in a data determiner of the data generating device of FIG. 2 according to an embodiment of the present disclosure.

FIG. 30 is a block diagram of a counter register included in a data determiner of the data generating device of FIG. 2 according to an embodiment of the present disclosure.

Referring to FIG. 30, the data determiner 400 may include a counter register 420. A length MPL of the filter mask pattern MSK_P may be stored in the counter register 420. The length MPL of the filter mask pattern MSK_P may be controlled by a controller 500. The controller 500 may be the central processing unit that controls the data generating device 10. For example, the controller 500 may decrease the value of the mask pattern register to decrease the length MPL of the filter mask pattern MSK_P. In addition, the controller 500 may increase the value of the mask pattern register to increase the length MPL of the filter mask pattern MSK_P. The value of the filter mask pattern MSK_P may be controlled by the controller 500. For example, the controller 500 may decrease the value of the mask pattern register to decrease the value of the filter mask pattern MSK_P. In addition, the controller 500 may increase the value of the mask pattern register to increase the value of the filter mask pattern MSK_P.

In an embodiment of the present disclosure, the filter mask pattern MSK_P may be stored in a counter register 420. The length MPL of the filter mask pattern MSK_P may be controlled by a controller 500.

Figure 31:
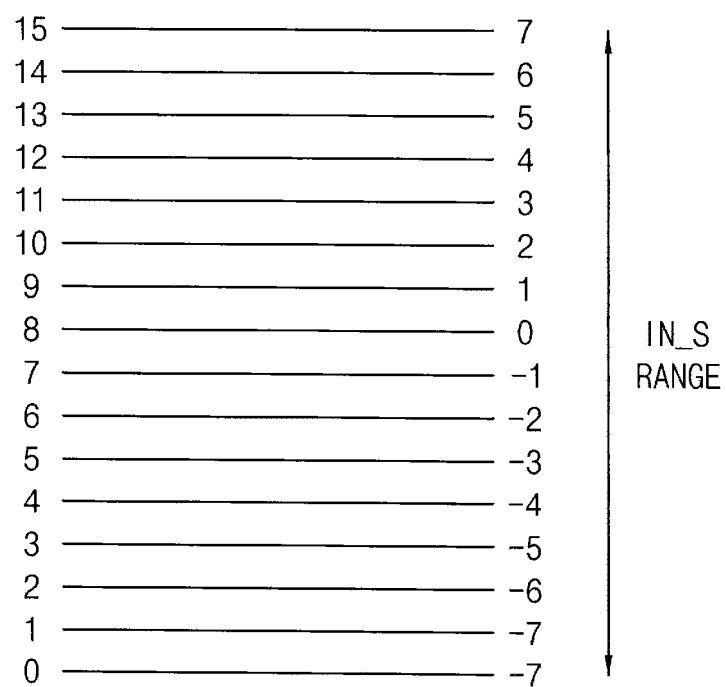
FIG. 31 is a graph of an input signal to the data generating device of FIG. 2 according to an embodiment of the present disclosure.

FIG. 31 is a graph of an input signal to the data generating device of FIG. 2 according to an embodiment of the present disclosure.

Referring to FIG. 31, the input signal IN_S may be indicated by a plurality of positive levels and a plurality of negative levels. For example, the input signal IN_S may include a plurality of levels. The plurality of levels included in the input signal IN_S may be from 0 to 15. The input signal IN_S may be indicated by the plurality of positive levels and the plurality of negative levels. The input signal IN_S that is indicated by the plurality of positive levels and the plurality of negative levels may be from −7 to 7. For example, when the input signal IN_S is 0, the indicated input signal IN_S may be −7. When the input signal IN_S is 1, the indicated input signal IN_S may be −7. When the input signal IN_S is 2, the indicated input signal IN_S may be −6. When the input signal IN_S is 3, the indicated input signal IN_S may be −5. In the same manner, when the input signal IN_S is 8, the indicated input signal IN_S may be 0. When the input signal IN_S is 15, the indicated input signal IN_S may be 7. The multiplication of the indicated input signal IN_S and the filter mask pattern MSK_P may be greater than the multiplication of the input signal IN_S that is not indicated and the filter mask pattern MSK_P. In this case, the result data RE_D corresponding to the input signal IN_S may be easily obtained using the indicated input signal IN_S. The method of generating data according to an embodiment of the present disclosure may increase the reception performance by providing the result data RE_D corresponding to the input signal IN_S based on the data determiner enable signal DD_EN, the input signal IN_S and the filter mask pattern MSK_P.

Figure 32:
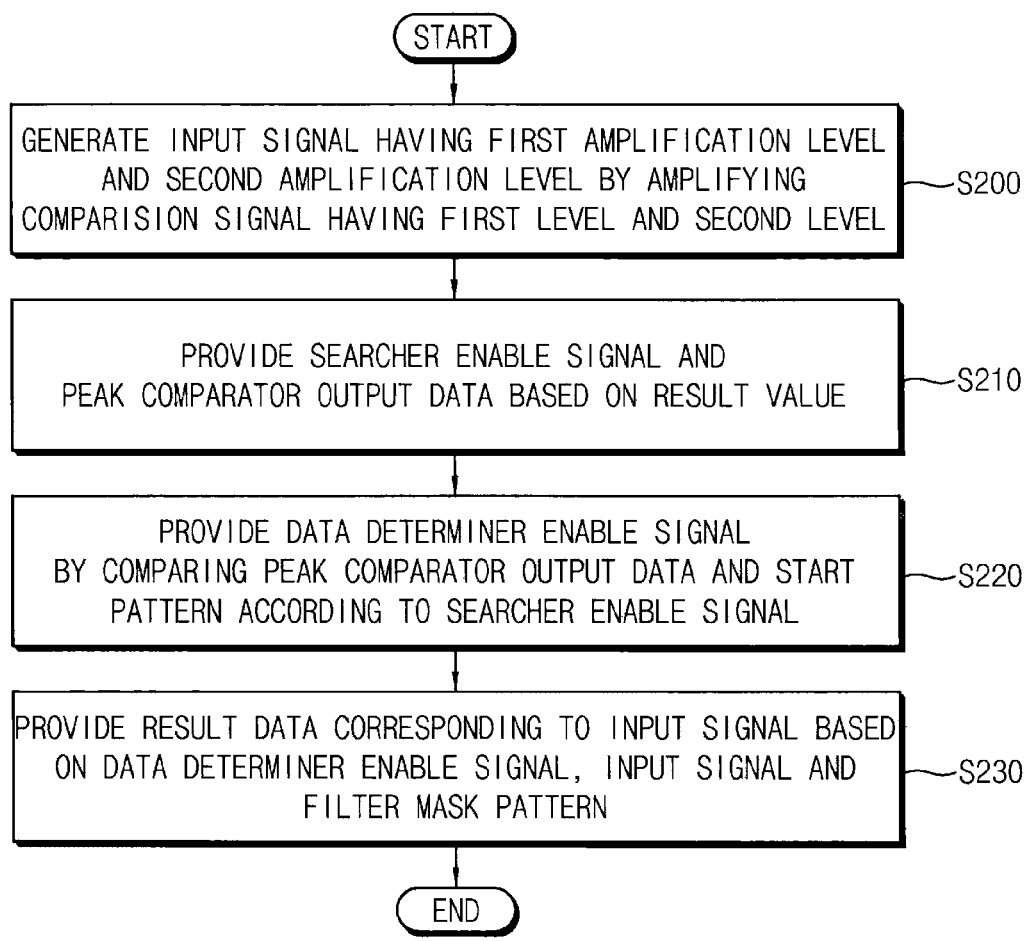
FIG. 32 is a flowchart of a method of generating data according to an embodiment of the present disclosure.
Figure 33:
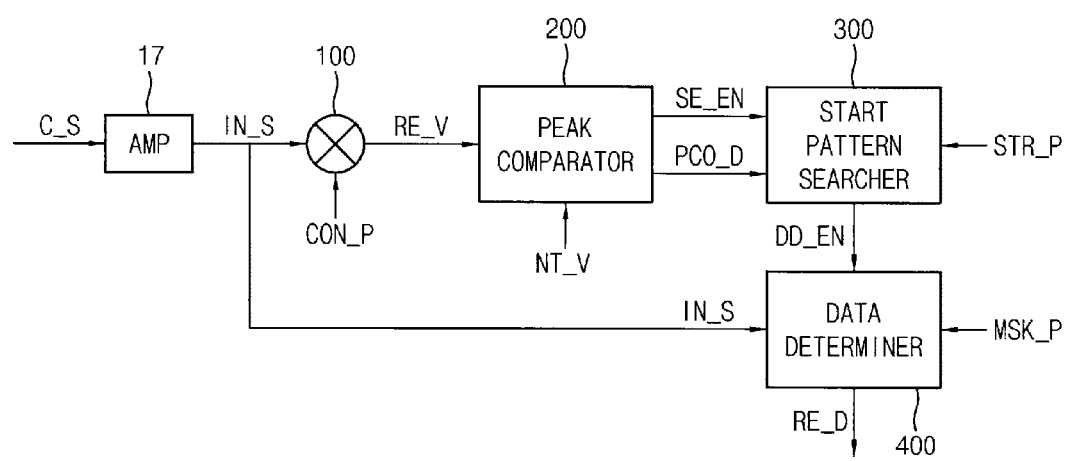
FIG. 33 is a block diagram of a data generating device according to an embodiment of the present disclosure.
Figure 34:
FIG. 34 is a graph of an operation of an amplifier included in the data generating device of FIG. 33 according to an embodiment of the present disclosure.

FIG. 32 is a flowchart of a method of generating data according to an embodiment of the present disclosure, FIG. 33 is a block diagram of a data generating device according to an embodiment of the present disclosure and FIG. 34 is a graph of an operation of an amplifier included in the data generating device of FIG. 33 according to an embodiment of the present disclosure.

Referring to FIGS. 32 to 34, a data generating device 10 may include an amplifier 17, a result value calculator 100, a peak comparator 200, a start pattern searcher 300 and a data determiner 400. In a method of generating data, the amplifier 17 generates an input signal IN_S having a first amplification level AL1 and a second amplification level AL2 by amplifying a comparison signal C_S having a first level L1 and a second level L2 in step S200. For example, the first level L1 of the comparison signal C_S may be 1 and the second level L2 of the comparison signal C_S may be 0. When the amplifier 17 generates the input signal IN_S having the first amplification level AL1 and the second amplification level AL2 by amplifying the comparison signal C_S having the first level L1 and the second level L2, the first amplification level AL1 of the input signal IN_S may be 7 and the second amplification level AL2 of the input signal IN_S may be −7. The result value calculator 100 may generate result values RE_V by multiplying the input signal IN_S and a predetermined convolution pattern CON_P. The peak comparator 200 provides a searcher enable signal SE_EN and peak comparator output data PCO_D based on result values RE_V that are generated by multiplying the input signal IN_S and the predetermined convolution pattern CON_P in step S210. The start pattern searcher 300 provides a data determiner enable signal DD_EN by comparing the peak comparator output data PCO_D and a predetermined start pattern STR_P according to the searcher enable signal SE_EN in step S220. A data determiner 400 provides a result data RE_D corresponding to the input signal IN_S based on the data determiner enable signal DD_EN, the input signal IN_S and a predetermined filter mask pattern MSK_P in step S230. In an embodiment of the present disclosure, when the result value RE_V is greater than a noise threshold value NT_V that is stored in the peak comparator 200, the searcher enable signal SE_EN may be activated. When the searcher enable signal SE_EN is activated, the peak comparator 200 may provide the peak comparator output data PCO_D corresponding to the result value RE_V. The method of generating data according to an embodiment of the present disclosure may increase the reception performance by providing the result data RE_D corresponding to the input signal IN_S based on the data determiner enable signal DD_EN, the input signal IN_S and the filter mask pattern MSK_P.

Figure 35:
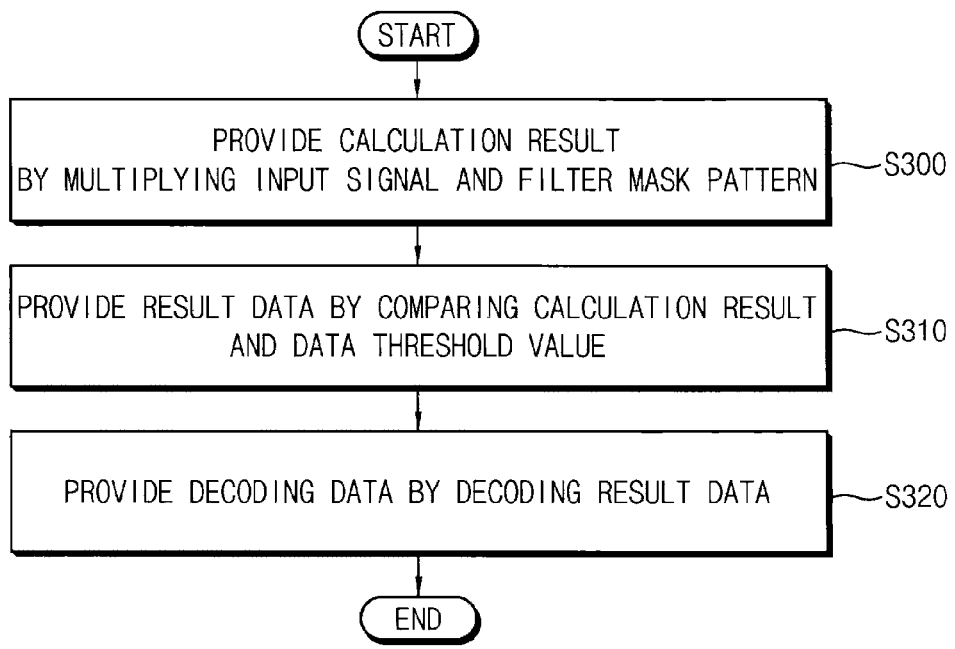
FIG. 35 is a flowchart of a method of generating data according to an embodiment of the present disclosure.
Figure 36:
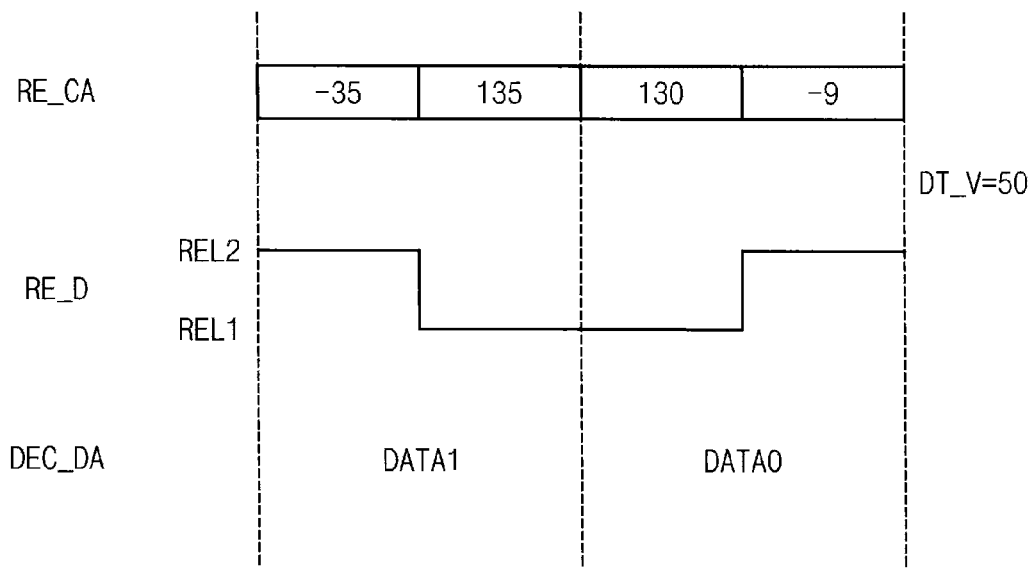
FIG. 36 is a graph of a decoding operation included in the method of generating data of FIG. 35 according to an embodiment of the present disclosure.

FIG. 35 is a flowchart of a method of generating data according to an embodiment of the present disclosure.

Referring to FIGS. 18 and 35, in a method of generating data, the calculator 410 provides the calculation result RE_CA by multiplying the input signal IN_S having a plurality of levels and the predetermined filter mask pattern MSK_P in step S300. The comparator provides the result data RE_D by comparing the calculation result RE_CA and the predetermined data threshold value DT_V in step S310. A decoder provides decoding data DEC_DA by decoding the result data RE_D in step S320. For example, the data threshold value DT_V is 50 and the calculation result RE_CA that is provided from the calculator 410 includes −35, 135, 130, −9. When the calculation result RE_CA that is provided from the calculator 410 includes −35, 135, 130, −9, the result data RE_D that is provided from the comparator 430 may be the second result level REL2, the first result level REL1, the first result level REL1, and the second result level REL2, respectively. When the result data RE_D that is provided from the comparator 430 is the second result level REL2, the first result level REL1, the first result level REL1, and the second result level REL2, respectively, the decoding data DEC_DA that is provided from the decoder included in the data determiner 400 may be 1 or 0. The method of generating data according to an embodiment of the present disclosure may increase the reception performance by providing the result data RE_D corresponding to the input signal IN_S based on the data determiner enable signal DD_EN, the input signal IN_S and the filter mask pattern MSK_P.

Figure 37:
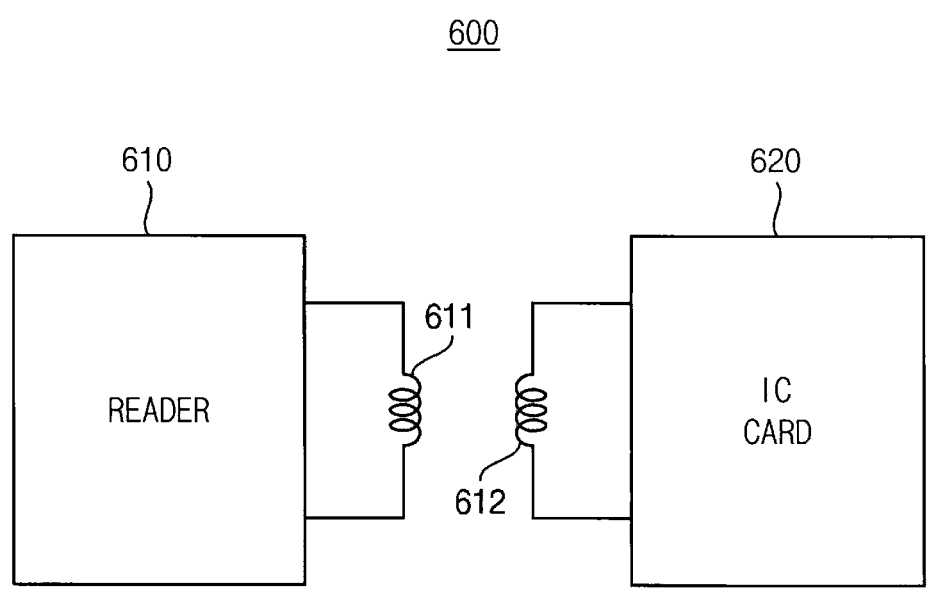
FIG. 37 is a block diagram of a contactless integrated circuit (IC) card system including a reader transceiver according to an embodiment of the present disclosure.

FIG. 37 is a block diagram of a contactless IC card system 600 including a reader transceiver according to an embodiment of the present disclosure.

Referring to FIG. 37, the contactless IC card system 600 includes a contactless IC card reader 610, a contactless IC card 620, a first antenna 611 and a second antenna 612. The contactless IC card reader 610 and the contactless IC card 620 exchange data with each other through the first and second antennas 611 and 612. The contactless IC card 620 may receive a voltage from the first antenna 611 through the second antenna 612.

Figure 38:
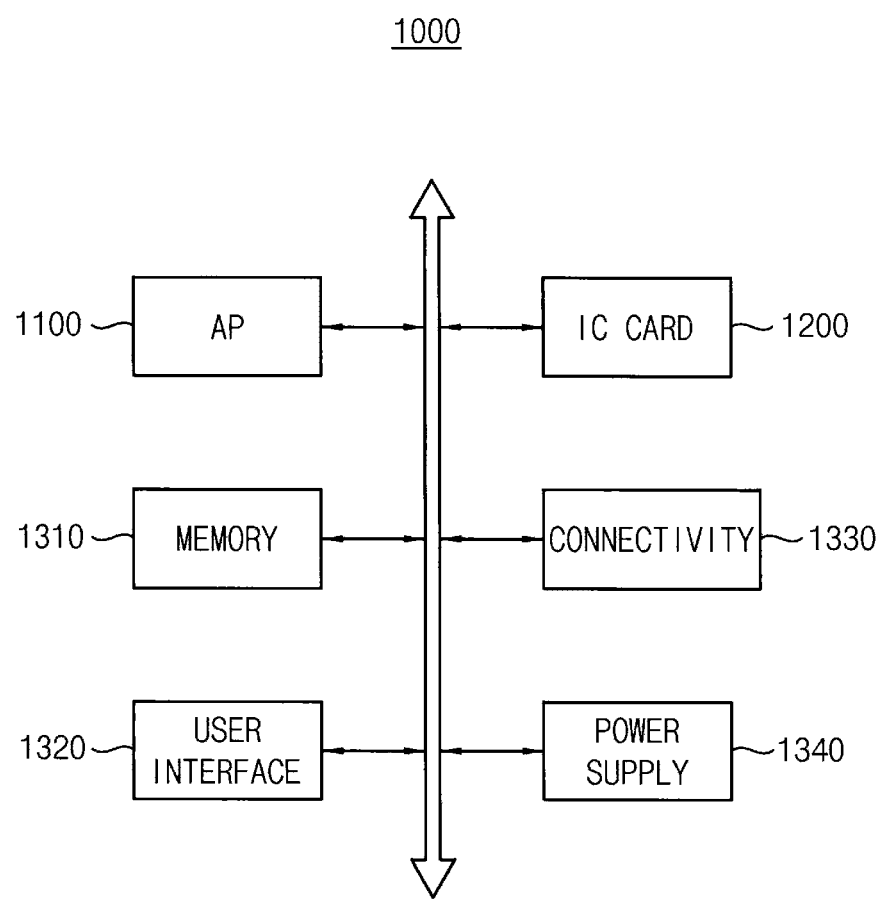
FIG. 38 is a block diagram of a mobile system according to an embodiment of the present disclosure.

FIG. 38 is a block diagram of a mobile system 1000 according to an embodiment of the present disclosure.

Referring to FIG. 38, the mobile system 1000 includes an application processor 1100, a contactless IC card 1200, a memory 1310, a user interface 1320, a connectivity unit 1330, and a power supply 1340. According to an embodiment an embodiment of the present disclosure, the mobile system 1000 may be any mobile system, such as a mobile phone, a smart phone, a personal digital assistant (PDA), a portable multimedia player (PMP), a digital camera, a portable game console, a music player, a camcorder, a video player, a navigation system, etc.

The application processor 1100 may execute applications, such as a web browser, a game application, a video player, etc. In an embodiment of the present disclosure, the application processor 1100 may include a single core or multiple cores. For example, the application processor 1100 may be a multi-core processor, such as a dual-core processor, a quad-core processor, a hexa-core processor, etc. According to an embodiment of the present disclosure, the application processor 1110 may be coupled to an internal/external cache memory. The controller 500 may be the application processor 1100.

The memory device 1310 may store a boot image for booting the mobile system 1000, output data to be transmitted to an external device, and input data received from the external device. For example, the memory device 1310 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The contactless IC card 1200 selects a reference voltage for the regulator in the internal voltage generator according to an operation mode that is determined based on whether the internal circuit performs an encryption operation. Thus, a fluctuation component is inhibited (or alternatively, prevented) from being transferred to the input voltage. Therefore, the contactless IC card 1200 may reduce (or alternatively) prevent transmission errors that may occur when the internal circuit performs an encryption operation.

The user interface 1320 may include at least one input device, such as a keypad, a touch screen, etc., and at least one output device, such as a speaker, a display device, etc. The power supply 1340 may supply a power supply voltage to the mobile system 1000.

The connectivity unit 1330 may perform wired or wireless communication with an external device. For example, the connectivity unit 1330 may perform Ethernet communication, near field communication (NFC), radio frequency identification (RFID) communication, mobile telecommunication, memory card communication, universal serial bus (USB) communication, etc. In an embodiment of the present disclosure, the connectivity unit 1330 may include a baseband chipset that supports communications, such as global system for mobile communications (GSM), general packet radio service (GPRS), wideband code division multiple access (WCDMA), high speed downlink/uplink packet access (HSxPA), etc.

In an embodiment of the present disclosure, the mobile system 1000 may further include a camera image processor (CIP), and/or a storage device, such as a memory card, a solid state drive (SSD), a hard disk drive (HDD), a CD-ROM, etc.

In an embodiment of the present disclosure, the mobile system 1000 and/or components of the mobile system 1000 may be packaged in various forms, such as a package on package (PoP), ball grid arrays (BGAs), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small outline IC (SOIC), a shrink small outline package (SSOP), a thin small outline package (TSOP), a system in package (SIP), a multi-chip package (MCP), a wafer-level fabricated package (WFP), or a wafer-level processed stack package (WSP).

The method of generating data according to an embodiment of the present disclosure may increase the reception performance by providing the result data RE_D corresponding to the input signal IN_S based on the data determiner enable signal DD_EN, the input signal IN_S and the filter mask pattern MSK_P.

The foregoing is illustrative of embodiments of the present disclosure but should not to be construed as limiting thereof. Although a few embodiments of the present disclosure have been described, those skilled in the art will readily appreciate that many modifications are possible in the embodiments without materially departing from the scope and spirit of the present disclosure. Accordingly, all such modifications are intended to be included within the scope of the present disclosure as defined in the appended claims and their equivalents. Therefore, it is to be understood that the foregoing is illustrative of various embodiments of the present disclosure and is not to be construed as limited to the embodiments disclosed, and that modifications to the disclosed embodiments, as well as other embodiments of the present disclosure, are intended to be included within the scope of the present disclosure as defined by the appended claims and their equivalents.

What is claimed is:

1. A method of generating data, comprising:
    providing, by a peak comparator, a searcher enable signal and peak comparator output data based on result values that are generated by multiplying an input signal having a plurality of levels and a predetermined convolution pattern;
    providing, by a start pattern searcher, a data determiner enable signal by comparing the peak comparator output data and a predetermined start pattern according to the searcher enable signal; and
    providing, by a data determiner, result data corresponding to the input signal based on the data determiner enable signal, the input signal and a predetermined filter mask pattern,
    wherein the data determiner provides the predetermined filter mask pattern to a calculator based on a time interval among peak values of the result values, and
    wherein a time when the predetermined filter mask pattern is provided to the calculator is determined by a timer value that is stored in a mask matching timer register.

2. The method of claim 1,
    wherein a level of the predetermined convolution pattern during a first pattern interval is a first pattern level and the level of the predetermined convolution pattern during a second pattern interval after the first pattern interval is a second pattern level that is different from the first pattern level.

3. The method of claim 2,
    wherein, if one of the result values is greater than a noise threshold value that is stored in the peak comparator, the searcher enable signal is activated, and
    wherein, if the searcher enable signal is activated, the peak comparator provides the peak comparator output data corresponding to the one of the result values.

4. The method of claim 3,
    wherein the predetermined convolution pattern is stored in a convolution pattern register and the predetermined convolution pattern is controlled by a controller.

5. The method of claim 1,
    wherein, if the searcher enable signal is activated and the peak comparator output data is equal to the predetermined start pattern, the data determiner enable signal is activated by the predetermined start pattern searcher.

6. The method of claim 5,
    wherein the predetermined start pattern is stored in a start pattern register and the predetermined start pattern is controlled by a controller.

7. The method of claim 1, wherein the data determiner further includes:
    the calculator configured to provide a calculation result by multiplying the input signal and the predetermined filter mask pattern; and
    a comparator configured to provide the result data by comparing the calculation result and a predetermined data threshold value.

8. The method of claim 7,
    wherein the predetermined filter mask pattern is in synchronization with the input signal.

9. The method of claim 8,
    wherein, if an absolute value of the calculation result is greater than the predetermined data threshold value, the comparator provides a first result level as the result data, and
    wherein, if the absolute value of the calculation result is less than the predetermined data threshold value, the comparator provides a second result level as the result data.

10. The method of claim 9,
    wherein, if each of the first result level and the second result level is sequentially repeated more than three times, the data determiner stops providing the result data.

11. The method of claim 1,
    wherein the predetermined filter mask pattern includes a plurality of odd number time intervals and a plurality of even number time intervals, the plurality of odd number time intervals being a first mask level, the plurality of even number time intervals being a second mask level.

12. The method of claim 11,
wherein a length of the predetermined filter mask pattern is stored in a counter register and the length of the predetermined filter mask pattern is controlled by a controller, and
wherein the input signal is indicated by a plurality of positive levels and a plurality of negative levels.

13. A method of generating data, comprising:
generating, by an amplifier, an input signal having a first amplification level and a second amplification level by amplifying a comparison signal having a first level and a second level;
providing, by a peak comparator, a searcher enable signal and peak comparator output data based on result values that are generated by multiplying the input signal and a predetermined convolution pattern;
providing, by a start pattern searcher, a data determiner enable signal by comparing the peak comparator output data and a predetermined start pattern according to the searcher enable signal; and
providing, by a data determiner, a result data corresponding to the input signal based on the data determiner enable signal, the input signal and a predetermined filter mask pattern,
wherein the data determiner provides the predetermined filter mask pattern to a calculator based on a time interval among peak values of the result values, and
wherein a time when the predetermined filter mask pattern is provided to the calculator is determined by a timer value that is stored in a mask matching timer register.

14. The method of claim 13,
wherein, if one of the result values is greater than a noise threshold value that is stored in the peak comparator, the searcher enable signal is activated, and
wherein, if the searcher enable signal is activated, the peak comparator provides the peak comparator output data corresponding to the one of the result values.

15. A data generating device, comprising:
a peak comparator configured to provide a searcher enable signal and peak comparator output data based on result values that are generated by multiplying an input signal having a plurality of levels and a predetermined convolution pattern;
a start pattern searcher configured to provide a data determiner enable signal by comparing the peak comparator output data and a predetermined start pattern according to the searcher enable signal; and
a data determiner configured to provide result data corresponding to the input signal based on the data determiner enable signal, the input signal and a predetermined filter mask pattern,
wherein the data determiner provides the predetermined filter mask pattern to a calculator based on a time interval among peak values of the result values, and
wherein a time when the predetermined filter mask pattern is provided to the calculator is determined by a timer value that is stored in a mask matching timer register.

16. The data generating device of claim 15, wherein the peak comparator includes a register configured to store a noise threshold value, and
wherein the peak comparator is configured to activate the searcher enable signal if one of the result values is greater than the noise threshold value that is stored in the register.

17. The data generating device of claim 15, wherein the start pattern searcher includes a register configured to store the predetermined start pattern, and
wherein the start pattern searcher is configured to activate the data determiner enable signal if the peak comparator output data is equal to the predetermined start pattern that is stored in the register.

18. The data generating device of claim 15, wherein the data determiner further includes:
the calculator configured to provide a calculation result by multiplying the input signal and the predetermined filter mask pattern; and
a comparator configured to provide the result data by comparing the calculation result and a predetermined data threshold value.

19. The data generating device of claim 15, further comprising:
an amplifier configured to generate the input signal having a first amplification level and a second amplification level by amplifying a comparison signal having a first level and a second level.

* * * * *